United States Patent
Watanabe

(10) Patent No.: US 7,652,317 B2
(45) Date of Patent: Jan. 26, 2010

(54) SEMICONDUCTOR DEVICE AND SEMICONDUCTOR SYSTEM

(75) Inventor: Hiroshi Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 191 days.

(21) Appl. No.: 11/538,631

(22) Filed: Oct. 4, 2006

(65) Prior Publication Data

US 2007/0158699 A1   Jul. 12, 2007

(30) Foreign Application Priority Data

Jan. 4, 2006   (JP)   ............................. 2006-000134

(51) Int. Cl.
*H01L 29/788* (2006.01)

(52) U.S. Cl. .................. 257/315; 257/316; 257/317; 257/320

(58) Field of Classification Search ................ 257/264, 257/315, 316, 317, 320
See application file for complete search history.

(56) References Cited

U.S. PATENT DOCUMENTS

| | | | |
|---|---|---|---|
| 5,801,414 A * | 9/1998 | Shinmori ..................... | 257/315 |
| 6,811,083 B2 | 11/2004 | Kojima et al. | |
| 6,853,583 B2 | 2/2005 | Diorio et al. | |
| 6,945,467 B2 | 9/2005 | Kojima et al. | |
| 7,075,284 B2 | 7/2006 | Watanabe et al. | |
| 7,078,761 B2 * | 7/2006 | Wang et al. ................. | 257/315 |
| 2004/0149816 A1 | 8/2004 | Tomoeda et al. | |
| 2006/0011971 A1* | 1/2006 | Hara ........................... | 257/316 |
| 2006/0192020 A1 | 8/2006 | Tomoeda et al. | |
| 2006/0196933 A1 | 9/2006 | Tomoeda et al. | |
| 2006/0208068 A1 | 9/2006 | Tomoeda et al. | |

FOREIGN PATENT DOCUMENTS

| | | |
|---|---|---|
| JP | 2004-94922 | 3/2004 |
| JP | 2004-172404 | 6/2004 |
| JP | 2005-310824 | 11/2005 |
| JP | 2005-533372 | 11/2005 |

OTHER PUBLICATIONS

U.S. Appl. No. 12/015,147, filed Jan. 16, 2008, Watanabe, et al.

(Continued)

*Primary Examiner*—Matthew E Warren
(74) *Attorney, Agent, or Firm*—Oblon, Spivak, McClelland, Maier & Neustadt, L.L.P.

(57) ABSTRACT

A semiconductor device includes a semiconductor substrate, a first and second semiconductor regions formed on the semiconductor substrate insulated and separated from each other, a gate dielectric film formed on the substrate to overlap the first and second semiconductor regions, a floating gate electrode formed on the gate dielectric film and in which a coupling capacitance of the first semiconductor region is larger than that of the second semiconductor region, first source and drain layers formed on the first semiconductor region to interpose the floating gate electrode therebetween, a first and second wiring lines connected to the first source and drain layers, respectively, second source and drain layers formed on the second semiconductor region to interpose the floating gate electrode therebetween, and a third wiring line connected to the second source and drain layers in common.

8 Claims, 28 Drawing Sheets

OTHER PUBLICATIONS

U.S. Appl. No. 12/049,715, filed Mar. 17, 2008, Watanabe, et al.
U.S. Appl. No. 11/469,706, filed Sep. 1, 2006, Hiroshi Watanabe, et al.
U.S. Appl. No. 11/366,465, filed Mar. 3, 2006, Takahiro Hirai.
U.S. Appl. No. 11/845,451, filed Aug. 27, 2007, Watanabe, et al.
U.S. Appl. No. 11/856,256, filed Sep. 17, 2007, Hagishima, et al.
U.S. Appl. No. 12/173,535, filed Jul. 15, 2008, Watanabe, et al.

* cited by examiner

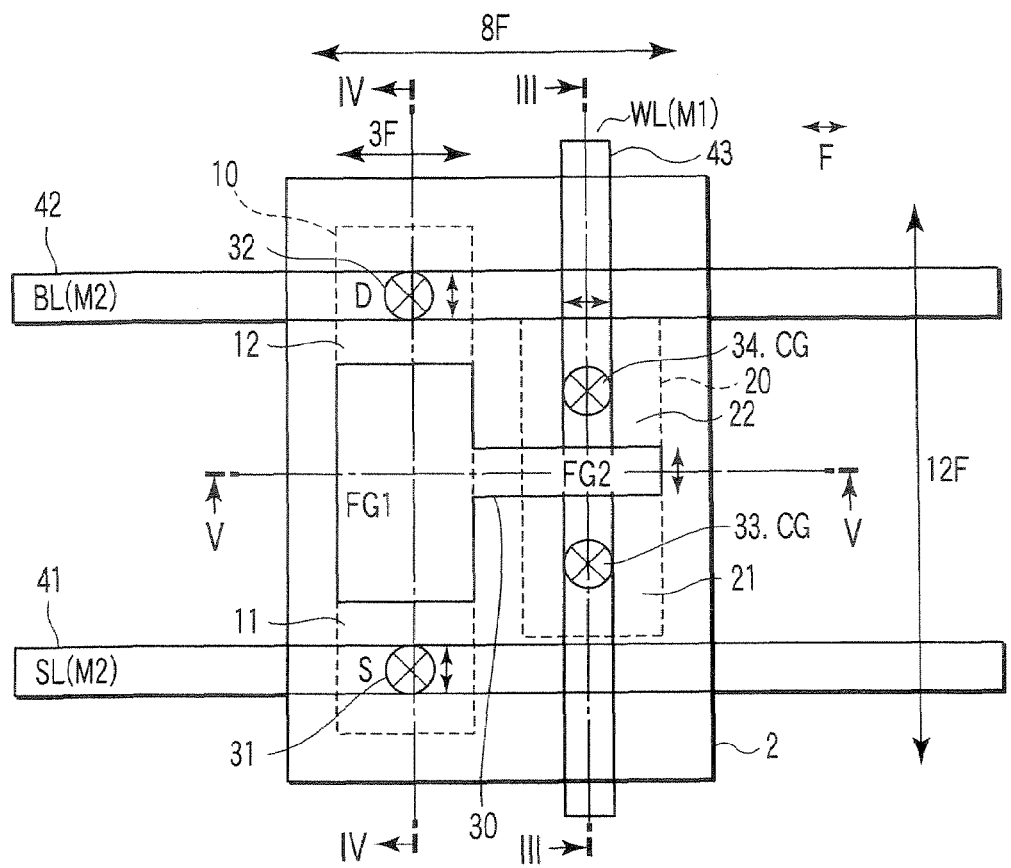
F I G. 1
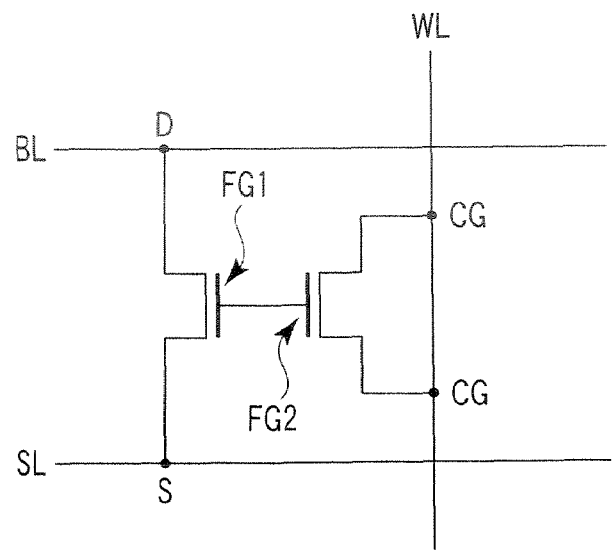
F I G. 2

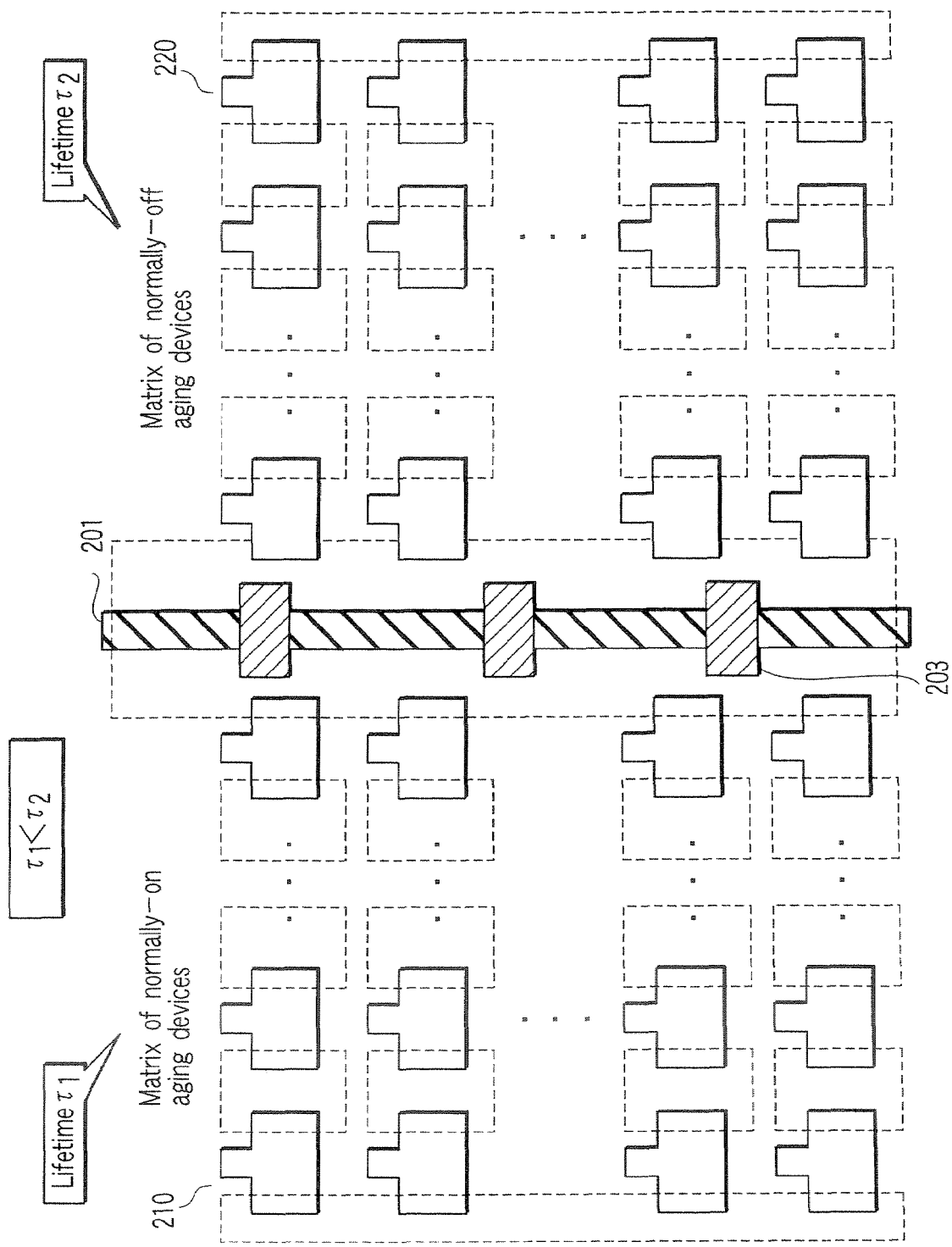
F I G. 25

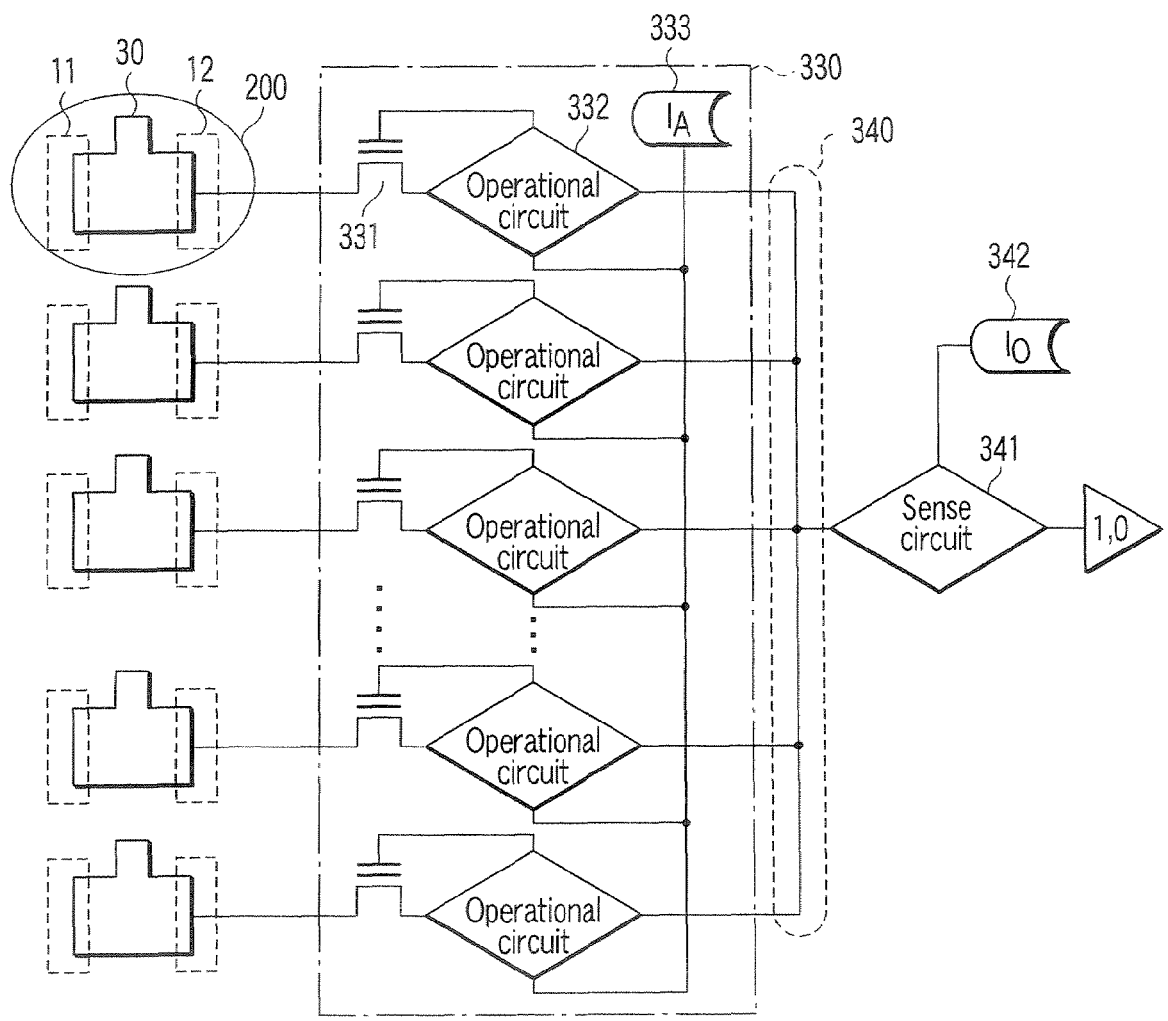
F I G. 30

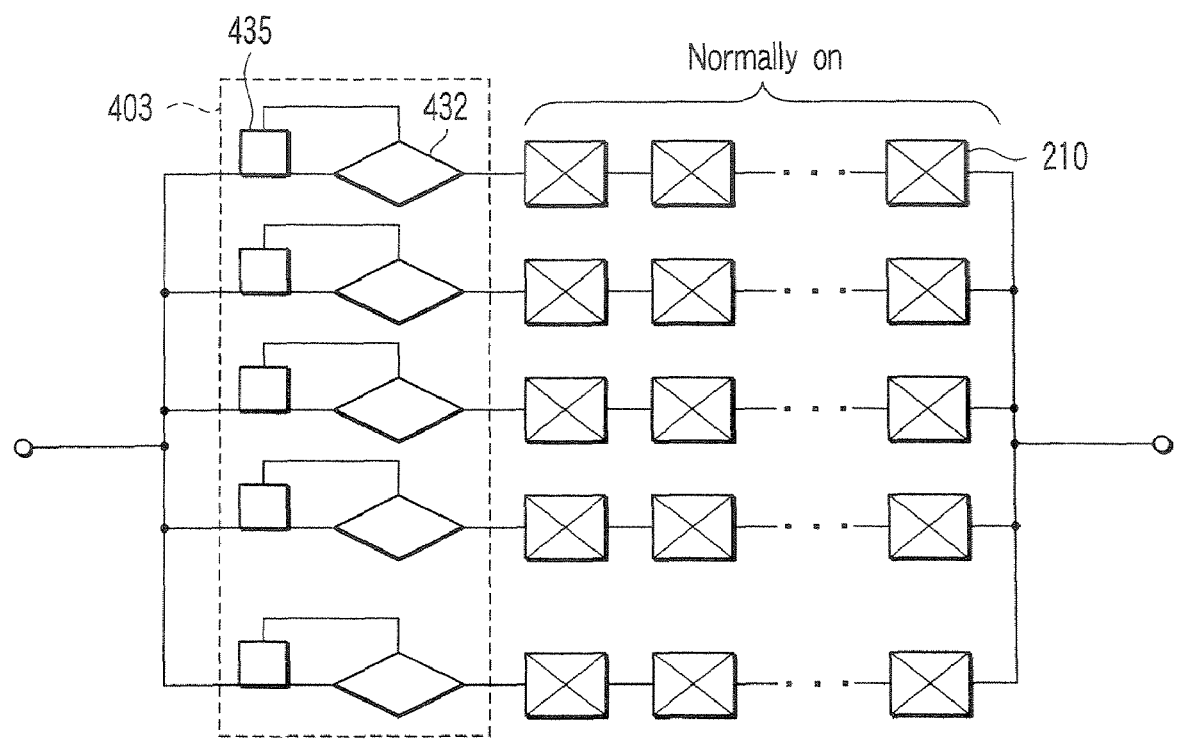
F I G. 3 5

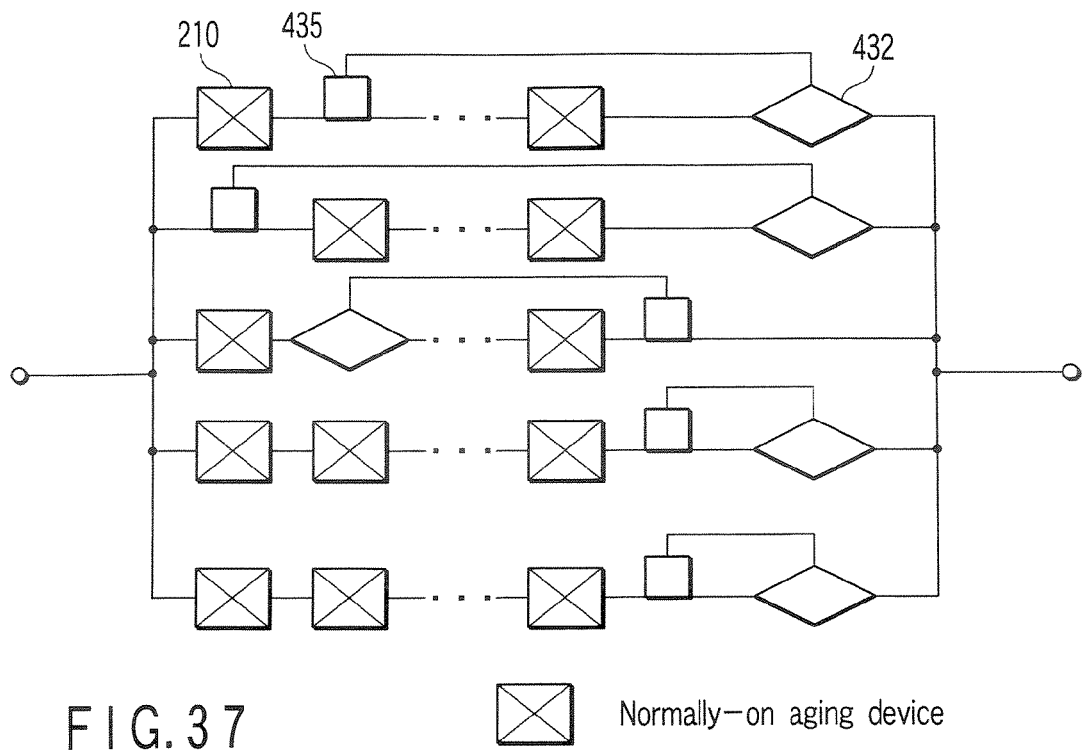
F I G. 37   ⊠ Normally-on aging device
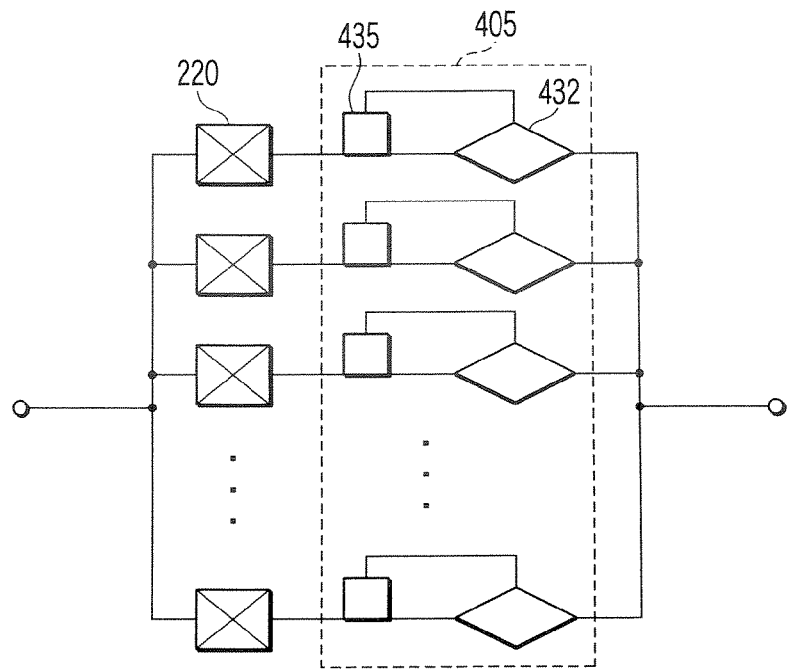
F I G. 38   ⊠ Normally-off aging device

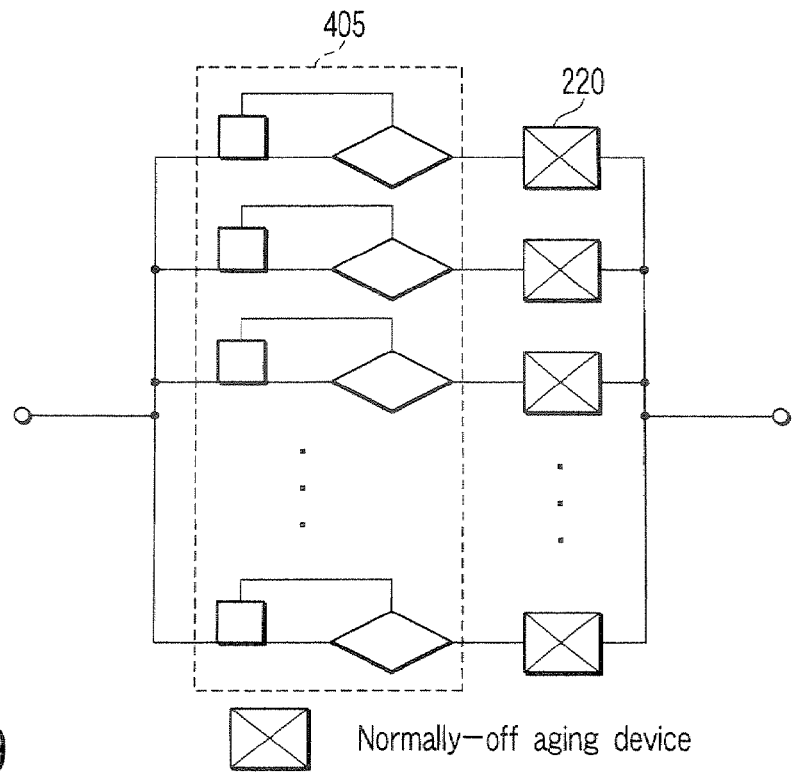
FIG.39   ☒ Normally-off aging device
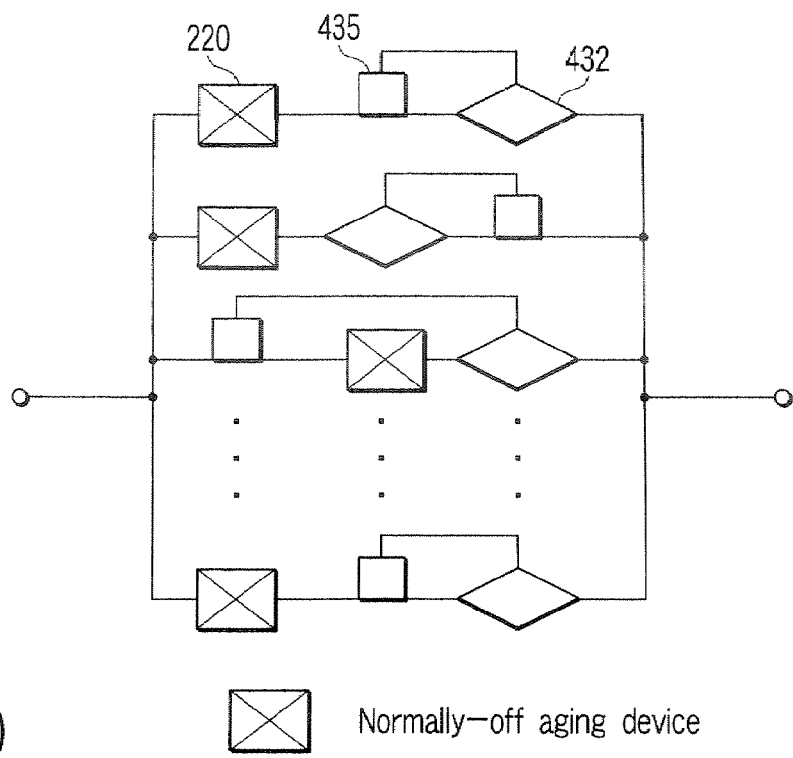
FIG.40   ☒ Normally-off aging device

SEMICONDUCTOR DEVICE AND SEMICONDUCTOR SYSTEM

CROSS-REFERENCE TO RELATED APPLICATIONS

This application is based upon and claims the benefit of priority from prior Japanese Patent Application No. 2006-000134, filed Jan. 4, 2006, the entire contents of which are incorporated herein by reference.

BACKGROUND OF THE INVENTION

1. Field of the Invention

The present invention relates to a single-gate structure MOS-type electrically-rewritable non-volatile semiconductor memory, and a semiconductor device which can be used as an aging device which is turned on or off for a fixed time by storage of electric charge. Further, the present invention relates to a semiconductor system using a plurality of aging devices.

2. Description of the Related Art

An electrically-rewritable non-volatile semiconductor memory or an electrically erasable programmable read-only memory (EEPROM) generally has a double-gate structure having a floating gate and a control gate. Further, an aging device which is turned on or off for a fixed time by storage of electric charge also has a double-gate structure as in the EEPROM (see, e.g., Jpn. Pat. Appln. KOKAI No. 2004-94922 and Jpn. Pat. Appln. KOKAI No. 2005-310824).

On the other hand, a general IC has a single-gate structure having a control gate along without a floating gate, and also has a CMOS structure in which MOS transistors which are of different conductivity types are arranged in a complementary manner. Therefore, when embedding an EEPROM or an aging device in this type of IC, processes must be again formed in order to take trouble to manufacture a floating gate. Adding a process of forming a floating gate in order to embed an EEPROM or an aging device in an IC having a single-gate structure has a negative impact on cost and increases the production price of a device.

It is to be noted that the floating gate device can be regarded as a non-volatile memory or as an aging device. That is, an electric charge storage time realized by the floating gate becomes sufficiently long when the film thickness of the gate dielectric film is relatively large, and it can be used as a non-volatile memory. On the other hand, when the film thickness of the gate dielectric film is sufficiently small, an electric charge storage time realized by the floating gate becomes short, and hence it is possible to use the aging device.

As described above, the EEPROM or the aging device conventionally has a double-gate structure having a floating gate and a control gate, this becomes a bottleneck when embedding the EEPROM or the aging device in a general IC having the single-gate structure, and also becomes a factor of increasing the manufacturing cost of the device.

Accordingly, there has been demanded realization of a semiconductor device which can realize a non-volatile semiconductor memory, an aging device or the like with a single-gate structure and can contribute to a reduction in manufacturing cost when embedding in an IC having the single-gate structure.

BRIEF SUMMARY OF THE INVENTION

According to a first aspect of the invention, there is provided a semiconductor device which includes:

a semiconductor substrate;
a first semiconductor region and a second semiconductor region formed on the semiconductor substrate to be insulated and separated from each other;
a gate dielectric film formed on the semiconductor substrate to overlap the first semiconductor region and the second semiconductor region;
a floating gate electrode which is formed on the gate dielectric film and in which a coupling capacitance with respect to the first semiconductor region is larger than a coupling capacitance with respect to the second semiconductor region;
first source and drain layers formed on a surface of the first semiconductor region to interpose the floating gate electrode therebetween;
a first wiring line connected to one of the first source and drain layers;
a second wiring line connected to the other of the first source and drain layers;
second source and drain layers formed on a surface of the second semiconductor region to interpose the floating gate electrode therebetween; and
a third wiring line connected to the second source and drain layers in common.

According to a second aspect of the invention, there is provided a semiconductor device which includes:

a semiconductor substrate;
a first semiconductor region and a second semiconductor region formed on the semiconductor substrate to be insulated and separated from each other;
a gate dielectric film formed on the semiconductor substrate to overlap the first semiconductor region and the second semiconductor region;
a floating gate electrode which is formed on the gate dielectric film and in which a coupling capacitance with respect to the first semiconductor region is larger than a coupling capacitance with respect to the second semiconductor region;
source and drain layers which are formed on a surface portion of the first semiconductor region to interpose the floating gate electrode therebetween;
a first wiring line connected to one of the source and drain layers;
a second wiring line connected to the other of the source and drain layers;
a diffusion layer formed on a surface portion of the second semiconductor region including a part below the floating gate electrode; and
a third wiring line connected to the diffusion layer.

According to a third aspect of the invention, there is provided a semiconductor device functioning as an aging device which is turned on or off for a fixed time by storage of electric charge, which includes:

a semiconductor substrate;
a first semiconductor region and a second semiconductor region formed on the semiconductor substrate to be insulated and separated from each other;
a gate dielectric film with a thickness of 3.3 nm or below, which is formed on the semiconductor substrate to overlap the first semiconductor region and the second semiconductor region;
a floating gate electrode which is formed on the gate dielectric film, formed into a T-shape in such a manner that a gate width thereof on the first semiconductor region side is longer than a gate width thereof on the second semiconductor region side, and formed in such a manner that a coupling capacitance thereof with respect to the first semiconductor region is larger than a coupling capacitance thereof with respect to the second semiconductor region;

first source and drain layers which are formed on a surface of the first semiconductor region to interpose a part below the floating gate electrode therebetween, one of the first source and drain layers being connected to a bit line while the other of the same being connected to a source line; and second source and drain layers which are formed on a surface of the second semiconductor region to interpose a part below the floating gate electrode therebetween and connected to a word line in common.

BRIEF DESCRIPTION OF THE SEVERAL VIEWS OF THE DRAWING

FIG. 1 is a plan view showing a schematic structure of an aging device having a single-gate structure according to a first embodiment of the present invention;

FIG. 2 is an equivalent circuit diagram showing the aging device according to the first embodiment;

FIG. 25 is a plan view showing an example in which a plurality of normally-on- and normally-off-type aging devices are connected;

FIG. 30 is a view showing an example in which a trimming circuit is mounted in a parallelizing circuit;

FIG. 35 is a view showing an example in which aging devices depicted in FIG. 33 are arranged on a right-hand side of a trimming circuit;

FIG. 37 is a view showing an example in which breakers are inserted into a series connection part of the aging devices;

FIG. 38 is a view in which normally-off aging devices are used, showing a relationship between parallel connection of the plurality of aging devices and a trimming circuit;

FIG. 39 is a view as a modification of FIG. 38, showing an example in which the aging devices are arranged on the right-hand side of the trimming circuit;

FIG. 40 is a view showing an example in which positions of the aging devices, the breakers and the operational circuits connected in series are changed in each row;

FIG. 41 is a view showing an example in which FIGS. 33 and 39 are combined; and

DETAILED DESCRIPTION OF THE INVENTION

Figure 3:
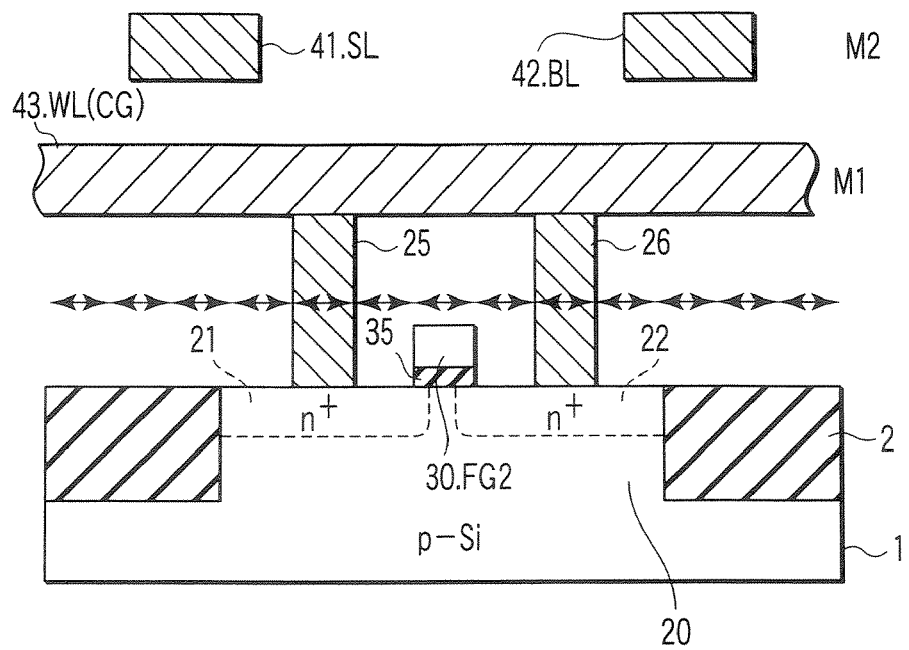
FIG. 3 is a cross-sectional view taken along a line III-III in FIG. 1.

According to embodiments of the present invention mentioned below, forming two MOS transistors substantially having a single-gate structure can manufacture an EEPROM or an aging device. Therefore, the EEPROM or the aging device can be manufactured with processes having excellent consistency with respect to a CMOS at a low cost. Accordingly, a manufacturing cost when embedding the EEPROM or the aging device in an IC having a single-gate structure can be reduced.

Embodiments according to the present invention will now be described with reference to the accompanying drawings.

First Embodiment

In a first embodiment, a description will be given as to an example of an application as an aging device, but application to an EEPROM with the same structure is possible. As shown in FIG. 1, two element regions 10 and 20 surrounded by shallow trench isolation (STI) 2 for element isolation are adjacently arranged. A floating gate electrode 30 composed of polysilicon or a metal is arranged to cut across a first element region (first semiconductor region) 10 and a second element region (second semiconductor region) 20. This gate electrode 30 is formed into a T-shape, and takes a floating form without being connected with any wiring line. Here, a part of the gate electrode 30 on the element region 10 side is referred to as FG1, and the other part of the same on the element region 20 side is referred to as FG2. Further, although not shown, a gate dielectric film composed of the same material as those of the element regions 10 and 20 is formed below the gate electrode 30.

In the first element region 10, a source diffusion layer 11 and a drain diffusion layer 12 are formed on both sides of FG1. That is, the source diffusion layer 11 and the drain diffusion layer 12 are formed to interpose a channel region under FG1 therebetween. Furthermore, the source diffusion layer 11 is connected with a source line (SL) 41, and the drain diffusion layer 12 is connected with a bit line (BL) 42. In the second element region 20, a source diffusion layer 21 and a drain diffusion layer 22 are formed on both sides of FG2. Moreover, the source diffusion layer 21 and the drain diffusion layer 22 are connected with a word line (WL) 43 in common.

The bit line BL and the source line SL are arranged in parallel, and are arranged perpendicularly to the word line WL0. Additionally, the bit line BL and the source line SL are formed in the same layer above the word line WL. Here, reference numeral 31 denotes a source line contact (S); 32, a bit line contact (D), and 33 or 34, a word line contact (CG).

In FIG. 1, a short arrow represents a minimum processing dimension length (F). In regard to a size of an entire cell, assuming that F is the minimum processing dimension, a lateral size is 8F, a vertical size is 12F and an occupied area is $96F^2$. Although it seems to be larger than a file memory cell whose size is $4F^2$, an aging device is used with a bridge structure held between an integrated memory cell array and a decoder, and hence it does not become disadvantageous for integration like the memory cell (see Jpn. Pat. Appln. KOKAI Publication No. 2004-94922 mentioned above). Since an occupied area of the aging device is as small as approximately $200F^2$ even though a circuit for lifetime control is included, a result of multiplying this area by a bit number (0.4 kb) required for a lifetime control circuit is just $8 \times 10^4 F^2$. On the other hand, giving a consideration on a memory cell array whose size is 1 Gb, an occupied area of the memory array is $4F^2 \times 1 Gb = 4 \times 10^9 F^2$. Therefore, an occupied area of the aging device is $2 \times 10^{-5}$ when reduced to the memory. Assuming that a price of a memory chip is 1000 yen (10 US$) as a result of a tolerable calculation, a price of the aging device is as small as 0.02 yen (0.02 cents).

However, this is a calculation when the aging device is embedded with the memory cell such as an EEPROM. In case of an IC product having no double-gate structure, adding a process having a double-gate structure for an aging device which has just a small occupied area increases a manufacturing cost severalfold. Thus, in case of applying to an IC card or the like, an aging device having a structure with good consistency with a CMOS is required.

A characteristic point in FIG. 1 lies in that the T-shaped floating gate electrode 30 cuts across the two regions (FG1 and FG2) to interpose a part of STI 2 therebetween. Further, since the floating gate electrode 30 has a T-shape, a gate area of FG1 is larger than a gate area of FG2. In this example, their area ratio is 5:1. This large gate area ratio is the maximum characteristic point in this embodiment as will be described later.

Next, control contacts (CG) connected with the word line WL are arranged to face each other in such a manner as to interpose FG2 therebetween in place of a control gate in a conventional memory cell. As a result, there can be provided a structure which avoids unnecessary expansion of the occupied area. If, CG is arranged on a right-hand side of FG2, an aging device cell must be 2F extended in a lateral direction of FIG. 1. The bit line BL is connected with a drain contact (D), and the source line SL which is grounded is connected with a source contact (S).

FIG. 3 shows a cross section taken along a line III-III in FIG. 1. In the second element region 20 surrounded by the STI 2 on a p-type Si substrate 1, the gate electrode 30 (FG2) is formed on a part of the element region 20 through the gate dielectric film 35 composed of a silicon oxide film or the like. The source diffusion layer 21 and the drain diffusion layer 22 are formed to interpose the channel region below the FG2 therebetween. A via-shaped electrode 25 or 26 is embedded in a non-illustrated interlayer dielectric film on each of these left and right diffusion layers 21 and 22, and the diffusion layers 21 and 22 are connected with the word line WL in a first metal layer (M1) through the electrodes 25 and 26. In this manner, a characteristic point lies in that both the source and drain diffusion layers 21 and 22 are connected with the word line WL as different from a regular MOSFET.

Another characteristic point as seen from this cross section lies in that the bit line BL and the source line SL composed of a second metal layer (M2) are arranged above the word line WL. If the arrangement order of these lines is inverted so that the source line SL and the bit line BL are arranged below the word line WL, a gap between the via electrodes 25 and 26 becomes too narrow, which may result in a short-circuit problem. Therefore, this region must be extended. This also increases an occupied area.

Figure 4:
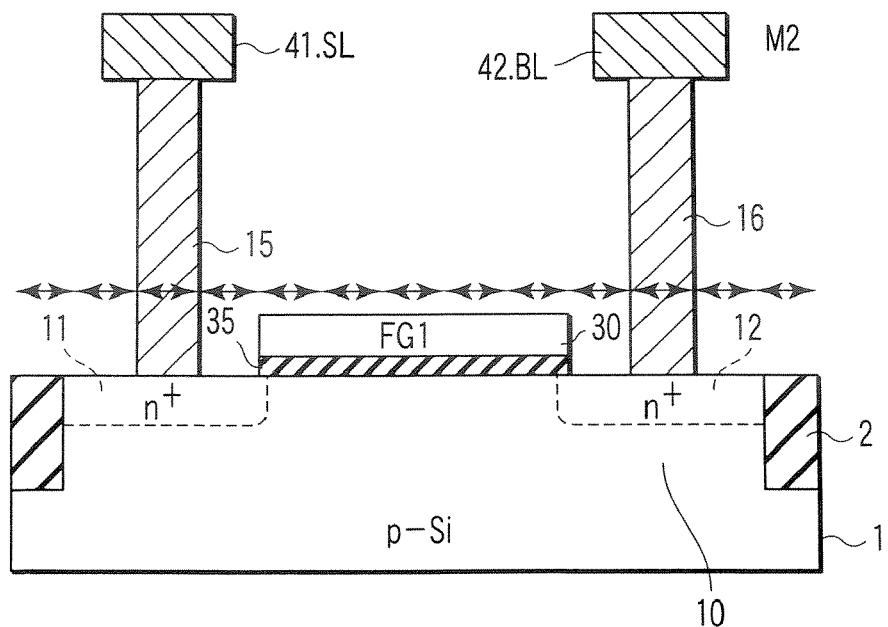
FIG. 4 is a cross-sectional view taken along a line IV-IV in FIG. 1.

FIG. 4 shows a cross section taken along a line IV-IV in FIG. 1. This cross-sectional structure is the same as that of a regular MOSFET except that FG1 is a part of a floating gate. That is, in the first element region 10 on the p-type Si substrate 1, the gate electrode 30 (FG1) is formed on a part of the element region 10 through the gate dielectric film 35 composed of a silicon oxide film or the like. The source diffusion layer 11 and the drain diffusion layer 12 are formed to interpose the channel region below the FG1 therebetween. The source diffusion layer 11 is connected with the source line SL (41) composed of the second metal layer (M2) through a via-shaped electrode 15. The drain diffusion layer 12 is connected with the bit line BL (42) composed of the second metal layer (M2) through a via-shaped electrode 16. Further, one of the greatest characteristics of this embodiment is that a control gate is not provided to the element as seen from this cross section even though this element is used as an EEPROM. It is to be noted that an illustration of the interlayer dielectric film is also omitted in FIG. 4.

Figure 5:
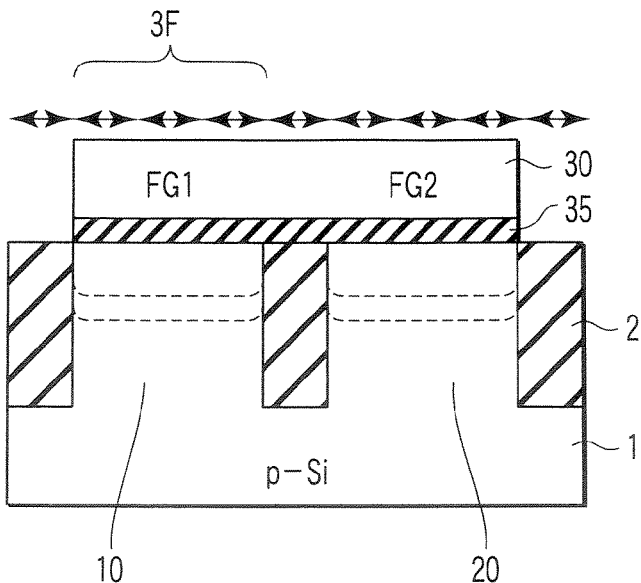
FIG. 5 is a cross-sectional view taken along a line V-V in FIG. 1.

FIG. 5 shows a cross section taken along a line V-V in FIG. 1. It can be understood from this cross-sectional view that FG1 and FG2 are constituted of a single type of polysilicon (single polysilicon) and are in a floating state. In this embodiment, the entire gate dielectric film 35 below both FG1 and FG2 is a thermally-oxidized film. This is the advantageous condition in terms of a manufacturing cost. A thickness of the gate dielectric film 35 is determined as, e.g., from 2 to 3 nm.

Figure 6A:
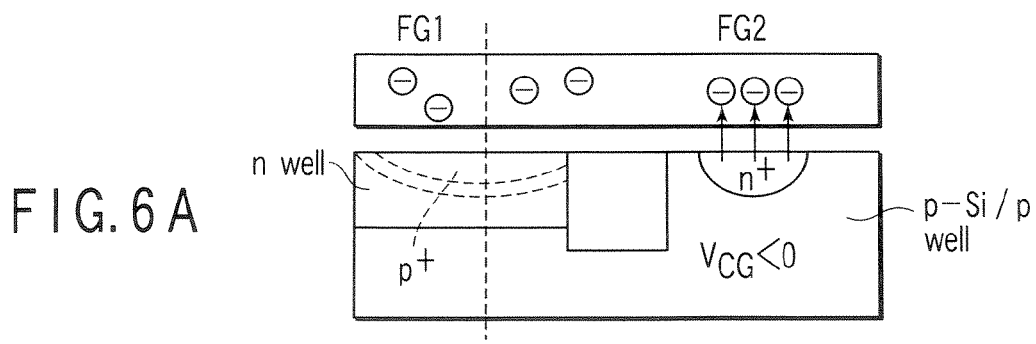
FIGS. 6A to 6C are schematic views illustrating an operational principle of the aging device according to the first embodiment.
Figure 6B:
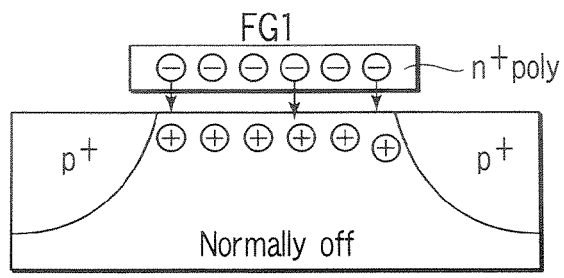
Figure 6C:
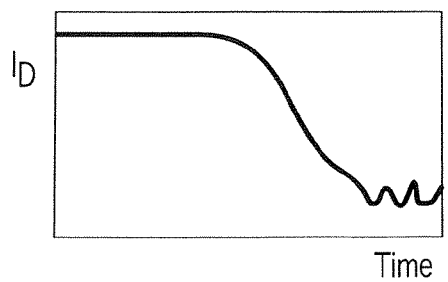
Figure 7A:
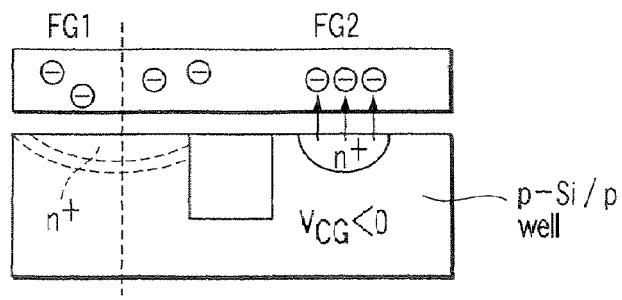
FIGS. 7A to 7C are schematic views illustrating the operational principle of the aging device according to the first embodiment.
Figure 7B:
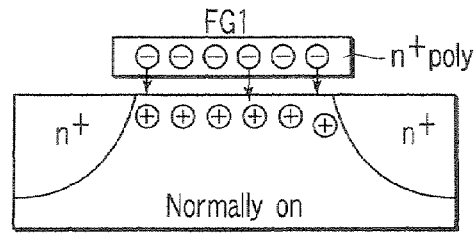
Figure 7C:
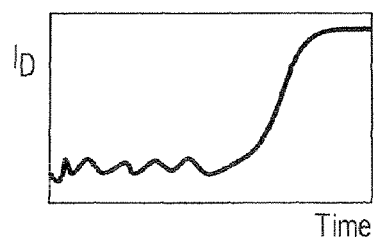

FIGS. 6A to 6C and FIGS. 7A to 7C are views illustrating an operational principle, especially a writing method of an aging device in this embodiment. Since the STIs on both sides are not shown, shapes of the source and drain are different from those mentioned above, but there is no essential difference. FIGS. 6A to 6C show a normally-off aging device which is of a p-channel type, and FIGS. 7A to 7C show a normally-on aging device which is of an n-channel type. Since the operational principle is equal in these devices except that an n well is provided in the element region 10 shown in FIGS. 6A and 6B, a description will be given as to the normally-on aging device depicted in FIGS. 7A to 7C.

First, reference will be made to FIG. 7A corresponding to a cross section of FIG. 5. Although either a p well or p-Si can be adopted, it is assumed that the substrate 1 is consists of p-Si in this example. A control gate voltage ($V_{CG}$) is negatively applied to the control gate contact CG from the word line WL. At this time, since a gate capacitance of FG1 is larger than a gate capacitance of FG2, a large electric field is applied to the gate dielectric film (a tunneling film) below FG2. On the other hand, almost no electric field is applied to the gate dielectric film below FG1, electrons do not move from FG1 to the source, the drain or the channel between the source and the drain in a tunneling manner. In this way, electrons are injected into FG2 from the n+ type diffusion layer. Since FG1 and FG2 are coupled with each other through single-polysilicon, electrons are transported from FG2 to FG1. Electrons are distributed in the entire FG1 and FG2.

Now, reference is made to FIG. 7B corresponding to a cross section taken along a line cutting across FG1, i.e., a cross section shown in FIG. 4. Since electrons injected in FG2 are distributed, holes are concentrated below FG1, and the channel enters the off state. Since the device is of the normally-on type from the beginning, the channel is kept in the off state until these electrons are removed. In the aging device, since the gate dielectric film is thinner than that of a memory cell, electors leak with elapse of time. Therefore, as shown in FIG. 7C, the off state changes to the on state with a predetermined time.

Therefore, using the normally-on type can realize an electron timer which is turned on after a fixed time from injection of electric charge. Here, a film thickness of the dielectric film 35 can be used to control a time required for the off state to change to the on state after injection of electric charge, i.e., a lifetime. For example, when a film thickness Tox of the gate dielectric film 35 composed of an oxide film is approximately 2 nm, the lifetime is approximately one minute. When Tox is approximately 2.5 nm, the lifetime is approximately one day. When Tox is approximately 3 nm, the lifetime is approximately one year. Further, when the film thickness Tox is set to be not smaller than 3.3 nm, the lifetimes becomes not shorter than 10 years, which is a sufficient recording/holding time as a non-volatile memory rather than the aging device.

Figure 8A:
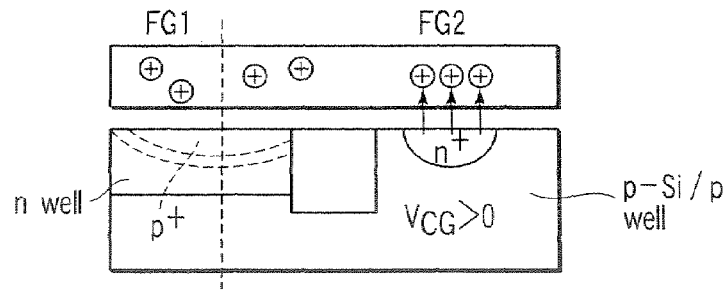
FIGS. 8A to 8C are schematic views illustrating the operational principle of the aging device according to the first embodiment.
Figure 8B:
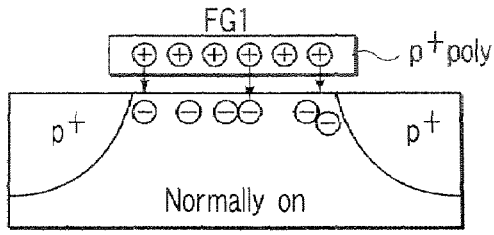
Figure 8C:
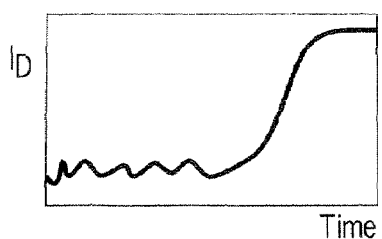
Figure 9A:
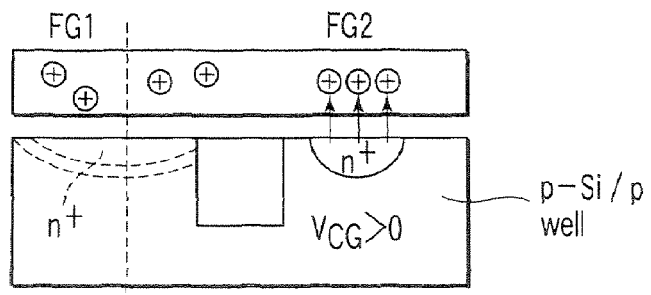
FIGS. 9A to 9C are schematic views illustrating the operational principle of the aging device according to the first embodiment.
Figure 9B:
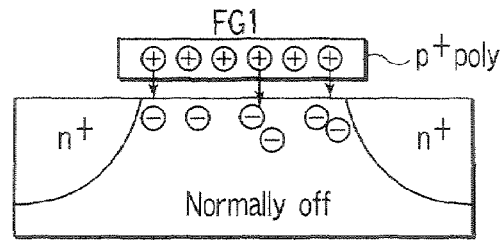
Figure 9C:
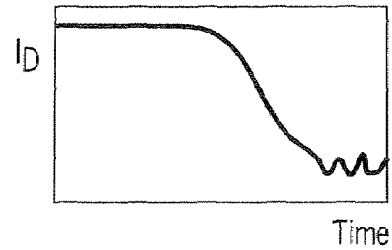

FIGS. 8A to 8C and FIGS. 9A to 9C are likewise views illustrating an operational principle of the aging device according to this embodiment. FIGS. 8A to 8C show a normally-on type with a p-channel, and FIGS. 9A to 9C show a normally-off type with an n-channel. Since a description there is the same as that mentioned above, it will be omitted.

Furthermore, combining the normally-on type with the normally-off type can manufacture an off-on-off type or an on-off-on type. Moreover, as will be described later, control times may be averaged by connecting a plurality of same aging devices in parallel or in series.

As described above, according to this embodiment, paying attention to the first MOS transistor on the first element region 10 side, the source and drain diffusion layers 21 and 22 of the MOS transistor on the second element region side function as control gates of the first MOS transistor, thereby demonstrating the same function as the aging device having a double-gate structure. Therefore, even though a single-gate structure is provided, it is possible to realize an aging device having the same function as an aging device having a double-gate structure. Therefore, it is no longer necessary to reincorporate a process for gate formation when embedding the device in an IC having a single-gate structure, thus greatly reducing manufacturing cost. Additionally, increasing a thickness of the gate dielectric film allows the device to be used as an EEPROM.

Second Embodiment

Figure 10:
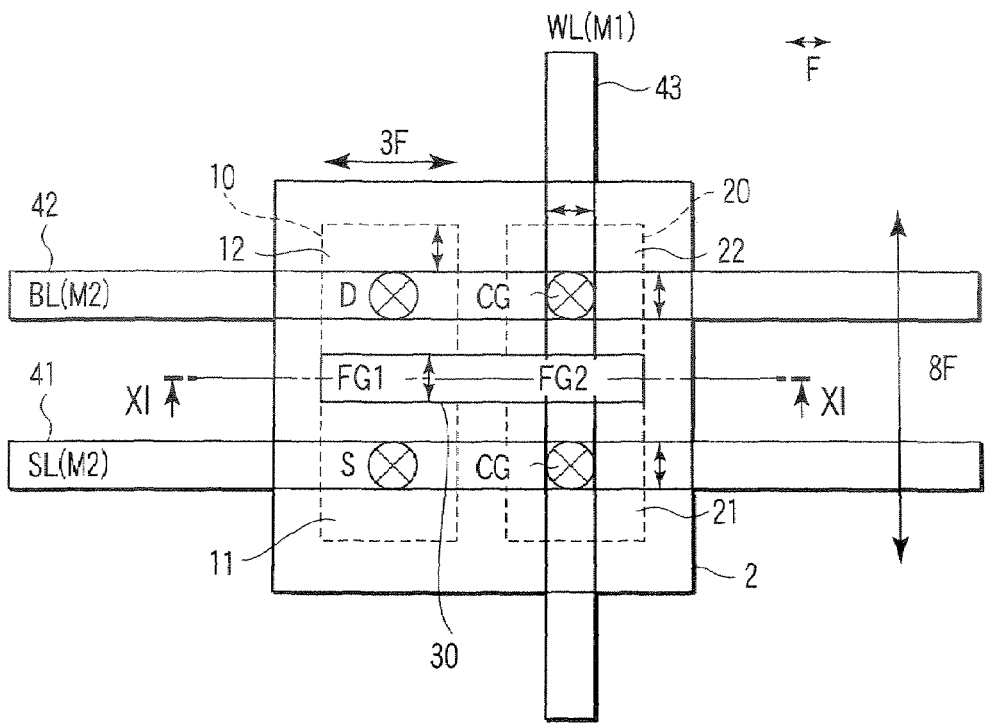
FIG. 10 is a plan view showing a schematic structure of an aging device having a single-gate structure according to a second embodiment.
Figure 11:
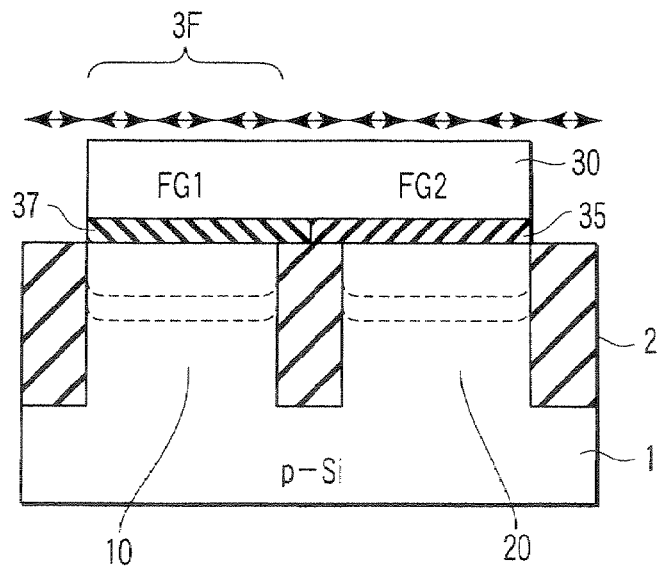
FIG. 11 is a cross-sectional view taken along a line XI-XI in FIG. 10.

A second embodiment is different from the first embodiment in that a High-K material is used for a dielectric film below FG1 as shown in FIGS. 10 and 11. That is, a gate dielectric film 35 below FG2 is a thermally-oxidized film as in the first embodiment, but a gate dielectric film 37 below FG1 is formed of, e.g., a hafnium oxide film (HfAlOx). It is to be noted that, in FIGS. 10 and 11, like reference numerals denote parts equal to those in FIG. 1, thereby omitting a detailed explanation thereof.

Figure 12:
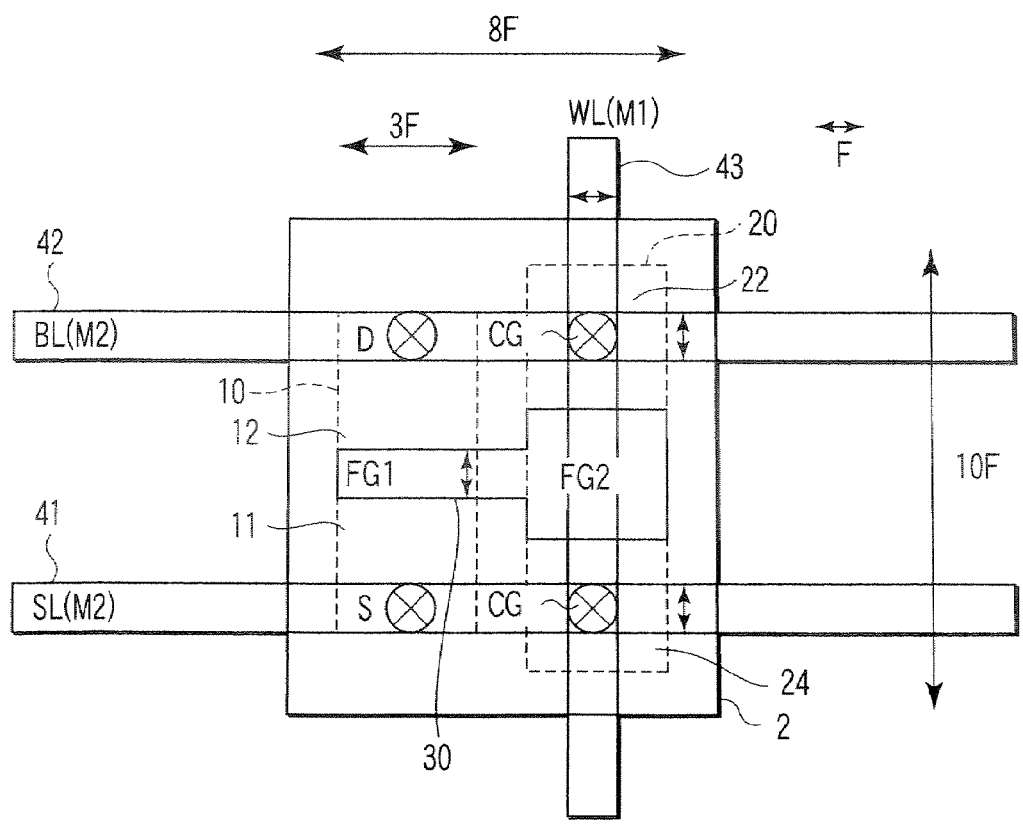
FIG. 12 is a plan view showing another example of the aging device according to the second embodiment.

According to such a configuration, as an element layout, a ratio of a gate area of FG1 and a gate area of FG2 can be reduced. The gate area of FG1 and the gate area of FG2 are equal in ratio in FIG. 10. The area ratio can be inverted as shown in FIG. 12 in some cases.

As a remarkable point in this example, an occupied area of a cell can be greatly saved when the High-K material used for the gate dielectric film 37 below FG1. Giving a description on the example of FIG. 1, a size in the vertical direction is reduced from 12F to 8F. As a result, an occupied area is also reduced to ⅔. On the other hand, in FIG. 12, since FG1 cannot be miniaturized to be smaller than the minimum processing dimension length F, and hence FG2 must be enlarged in order to invert the areas of FG1 and FG2. Therefore, the occupied area in the vertical direction becomes 1F, and the occupied area reduction effect is not as great as that shown in FIG. 10.

The reduction effect using the High-K material in this manner becomes maximum when the gate area of FG1 is equal to the gate area of FG2.

A point to notice when using the High-K material is the expensiveness of the High-K material and reliability of a High-K film. This embodiment is intended to provide an inexpensive aging device, and hence the High-K material must be used in accordance with a system design while paying attention to the occupied area reduction effect by the High-K material and trade-off of a price of the High-K material. For example, when the High-K film is used in an IC having one aging device alone, since the occupied area reduction effect is limited, use of the High-K film should be avoided unless the High-K film is used for an embedded transistor. On the other hand, in a system using many aging devices, a design which uses the High-K film to maximize the occupied area reduction effect is possible.

Now, in regard to the reliability problem, a countermeasure against a defective bit is taken by parallelizing or serializing the aging devices as described in the section of the prior art, but the number of cells arranged in parallel or in series is increased when the reliability of each cell itself is low. Therefore, the occupied area may be adversely increased in some cases. When using the High-K film, such a problem must be taken into consideration to design the system.

Third Embodiment

Figure 13:
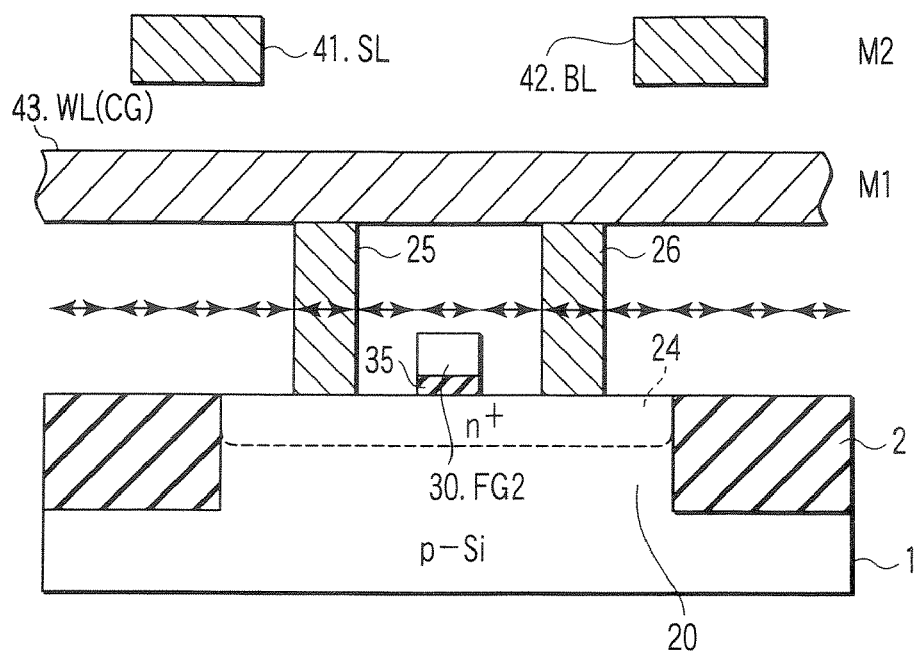
FIG. 13 is a cross-sectional view showing a structure of a second element regional section of an aging device according to a third embodiment, and corresponds to a cross section taken along a line III-III in FIG. 1.

A third embodiment is different from the first embodiment in that a diffusion layer 24 is formed on an entire surface of a second element region 20 on both sides of FG2 as well as below FG2 in the element region 20 as shown in FIG. 13. In order to obtain such a structure, the $n^+$ type diffusion layer 24 must be manufactured on a surface portion of the element region 20 on a stage before forming FG2.

Figure 14:
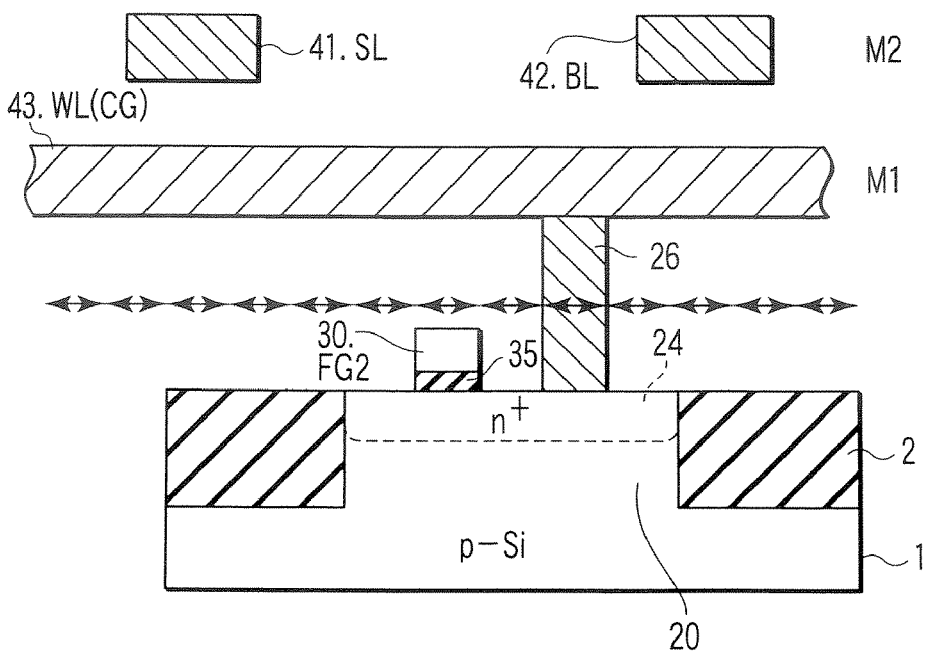
FIG. 14 is another cross-sectional view showing the second element regional section of the aging device according to the third embodiment, and corresponds to a cross-sectional view taken along a line XIV-XIV in FIG. 15.
Figure 15:
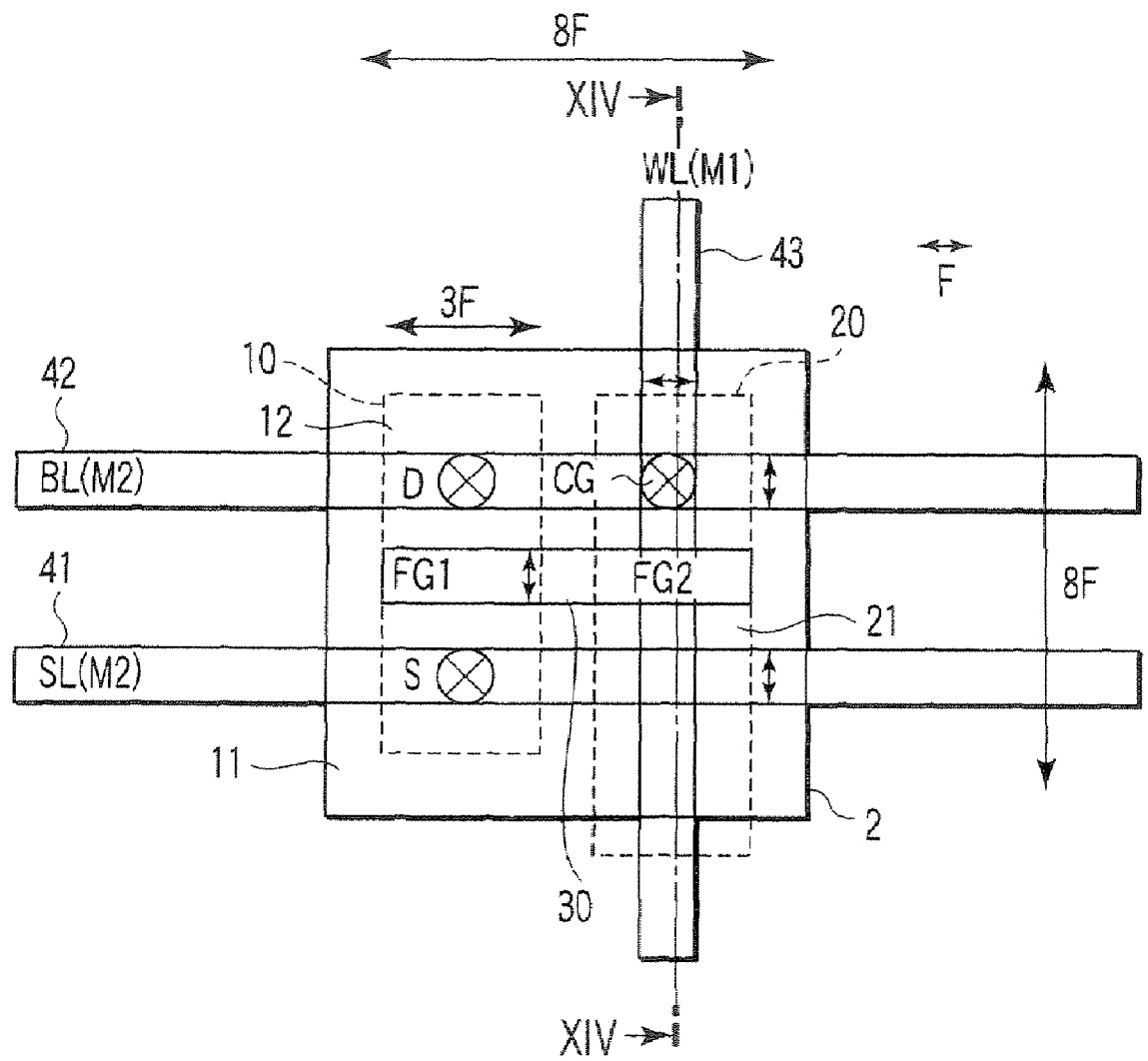
FIG. 15 is a plan view showing a schematic structure of the aging device according to the third embodiment.

Further, in this structure, as shown in FIG. 14, word line contacts (CG) can be reduced to one. FIG. 15 is a plan view showing an element layout when the word line contacts (CG) is reduced to one. FIG. 14 shows a cross section taken along a line XIV-XIV in FIG. 15.

A point to notice in the element layout according to this embodiment is that manufacturing unevenness in a distance from CG to FG2 may affect writing characteristics. In regard to this point, since the structure of FIG. 13 in which CG is also provided on the opposite side of FG2 can average irregularities in position of two CGS, thereby providing a further robust design.

The following shows a relationship between a write voltage ($V_{CG}$), a gate area ratio (or a dielectric constant ratio) and an applied electric field ($\alpha$) in writing.

$$V_{CG} = \alpha \times \{(C1+C2)/C1\} \times T_{OX}$$

Here, $T_{OX}$ denotes a gate dielectric film thickness below FG1 and FG2. C1 and C2 represent gate capacitances of FG1 and FG2, respectively. The gate capacitance is in inverse proportion to the dielectric film thickness, but in proportion to the gate area and the relative dielectric constant. In this expression, $\alpha$ is increased as C2 becomes smaller with respect to supplied $V_{CG}$. That is, this means that writing can be performed with low $V_{CG}$. In the above-described structure, the gate area of the FG1 is increased or the High-K dielectric film is used below FG1 in order to increase C1 with respect to C2.

Furthermore, $\alpha$ in the above expression becomes larger than approximately 10 MV/cm when a writing time is equal to that in a conventional flash memory. In an application where the writing time can be prolonged, a value of $\alpha$ can be reduced. According to this method, the operating voltage $V_{CG}$ can be likewise reduced. This method becomes prevailing when the number of aging device units to be mounted is small.

Fourth Embodiment

A description will be given as to a countermeasure against a defective bit when a normally-off MOS transistor is used as an aging device in this embodiment.

In the normally-off type, when a fixed time (a lifetime) elapses after injection of electric charge, its on state changes to an off state. A defective bit generally has a shorter lifetime than that of a normal bit. Therefore, aligning a plurality of aging devices in parallel allows a normal bit to permit access between a source and a drain even when a defective bit enters the off state before the normal bit.

Figure 16:
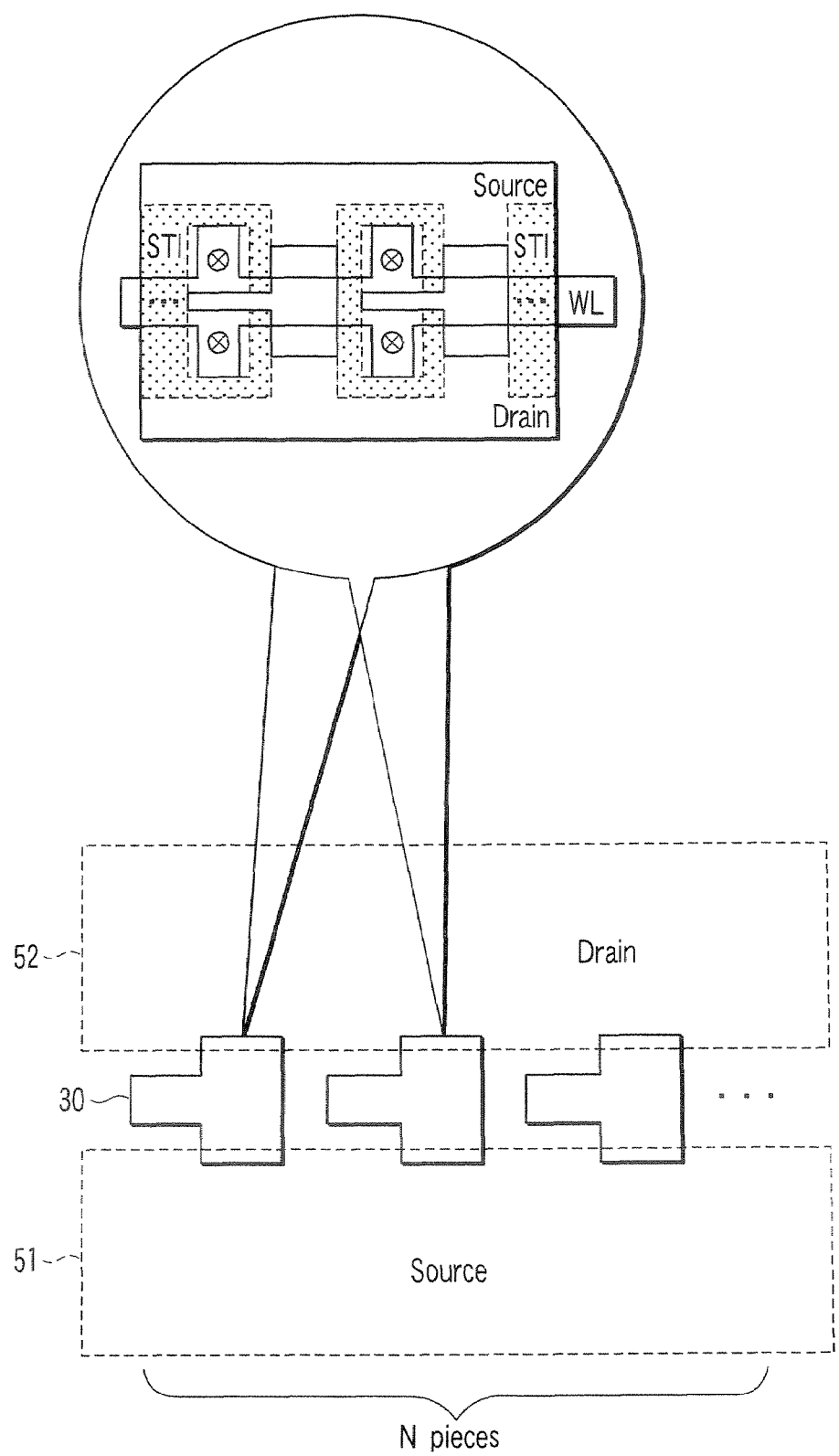
FIG. 16 is a plan view illustrating a semiconductor device according to a fourth embodiment, in which aging devices are connected in parallel as a countermeasure against a normally-off-type defective bit.

As shown in FIG. 16, the plurality of (N) aging devices described in the first embodiment are connected with each other in parallel with source and drain diffusion layers on a first MOS transistor (FG1 side) being used as connection terminals. That is, the source diffusion layer of the first MOS transistor of each aging device is connected with a common source 51 and the drain diffusion layer of the same is connected with a common drain 52.

Figure 17A:
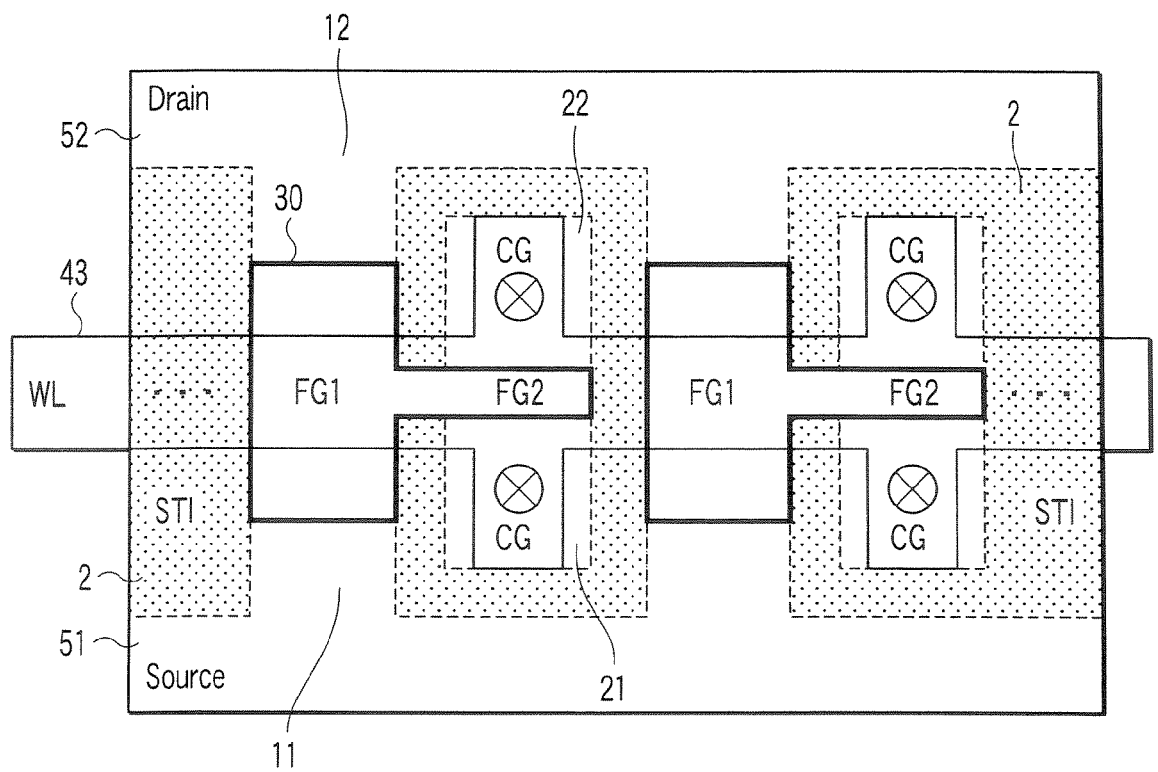
FIGS. 17A and 17B are plan views showing arrangement examples of the aging devices.
Figure 17B:
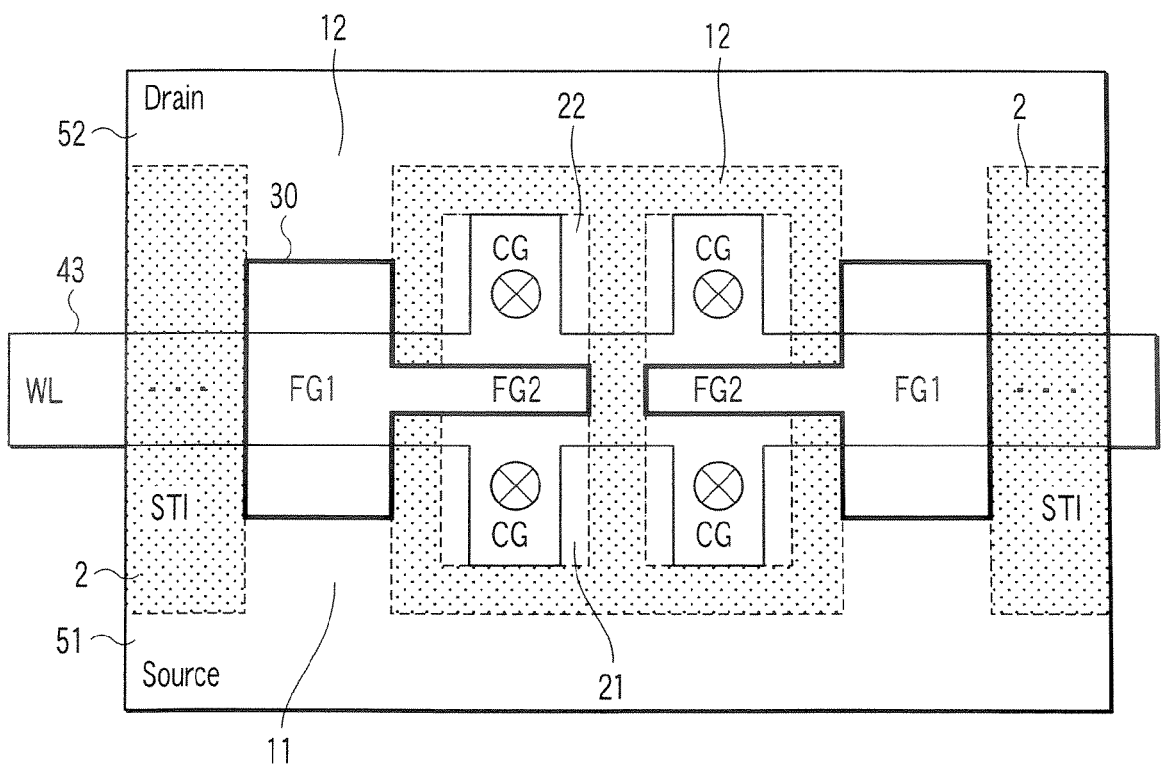

As arrangement examples of the aging devices, FIGS. 17A and 17B can be considered. In FIG. 17A, T-shaped floating gate electrodes 30 (FG1 and FG2) of aging devices are adjacent to each other and face the same direction. In FIG. 17B, T-shaped floating gate electrodes 30 (FG1 and FG2) are adjacent to each other but face opposite directions.

In a first element region, a source diffusion layer 11 of a first MOS transistor is connected with a common source 51, and a drain diffusion layer 12 is connected with a common drain 52. That is, each of the source 51 and the drain 52 are formed of a common diffusion layer. In both the source 51 and the drain 52, convex diffusion layers are continuously formed, and the convex diffusion layers become the source and drain diffusion layers 11 and 12 of the first MOS transistor. The second element region is surrounded by an STI 2, and each second element region is completely separated from the other second element region.

Moreover, a word line WL is formed to extend in a gate width direction, the diffusion layer below the FG2 is formed to protrude in a gate length direction, and this protruding portion is connected with each word line contact (CG). When the number N of aging devices connected in parallel is increased to be not smaller than 20, statistical correction is added to lifetime control, which is preferable. Of course, even if the number N is not greater than 20, the countermeasure against a defect bit can be also taken.

Figure 18:
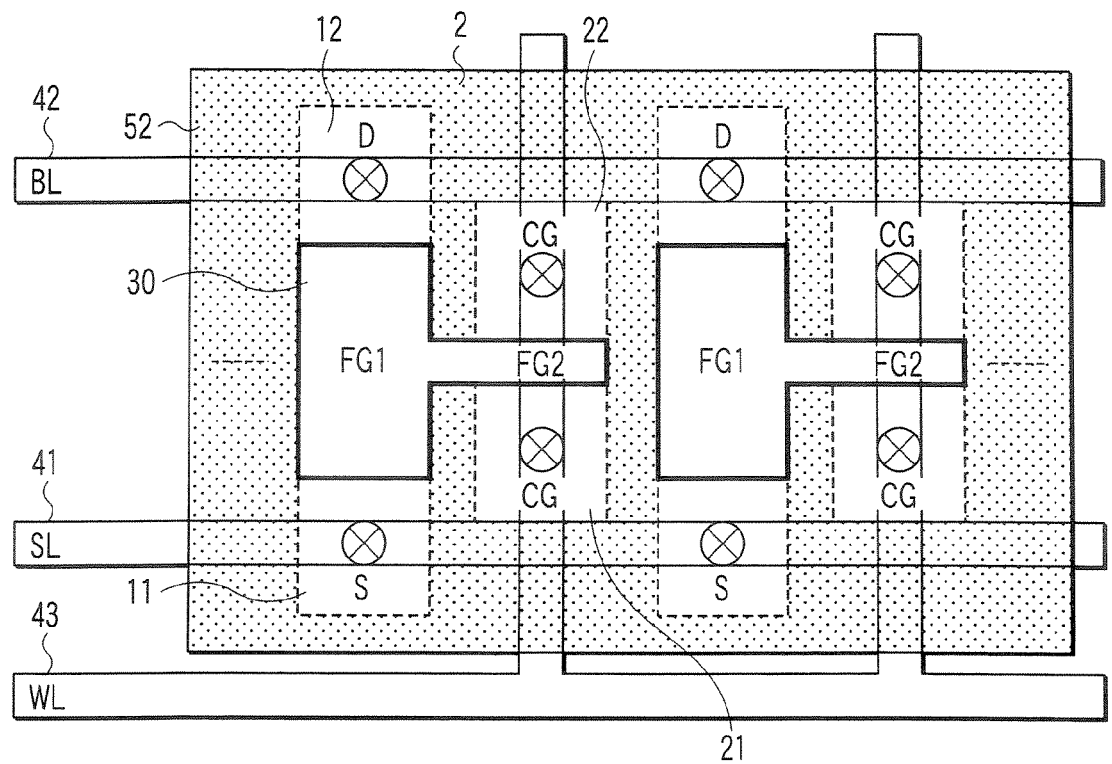
FIG. 18 is a plan view showing another arrangement example of the aging devices.

FIG. 18 shows another example. First and second element regions are subjected to element isolation by an STI 2, a source diffusion layer 11 of a first MOS transistor is in contact with a source line SL, and a drain diffusion layer 12 is in contact with a bit line BL. A main word line WL is arranged in parallel with the bit line BL and the source line SL, but a branched word line WL is perpendicular to the bit line BL and the source line SL and connected with CG of a second MOS transistor. Respective contacts (D and S) of the bit line BL and the source line SL and a word line contact (CG) are aligned in a zigzag form. When the number N of aging devices connected in parallel is increased to be not smaller than 20, statistical correction can be added to lifetime control, which is preferable. Of course, even when the number N is not greater than 20, a countermeasure against a defect bit can be taken.

Figure 19:
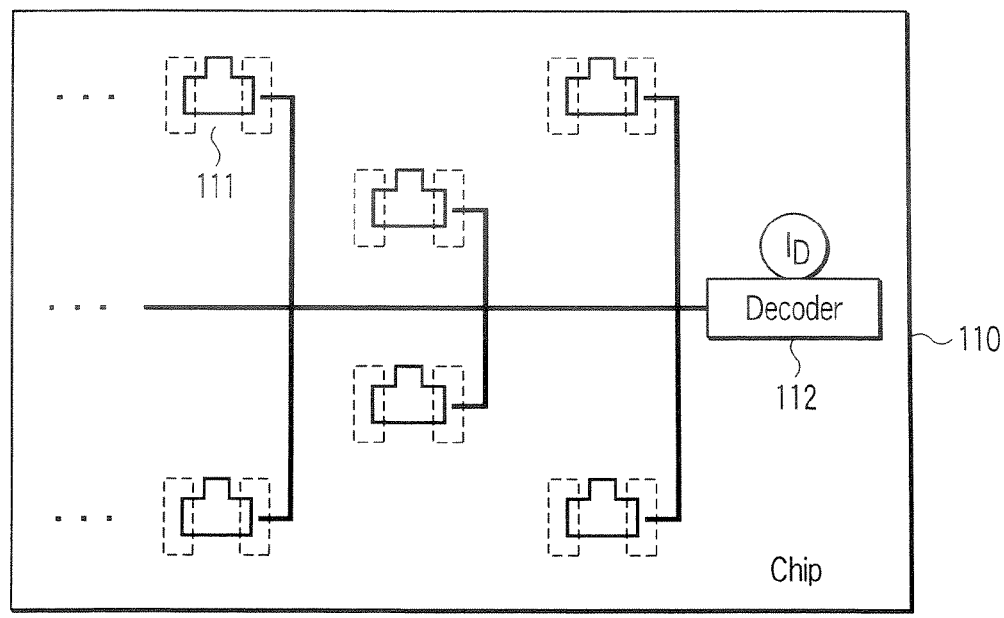
FIG. 19 is a plan view showing an example in which the aging devices connected in parallel are dispersed and arranged.

FIG. 19 is a plan view showing an arrangement example on a chip. Aging device cells aligned in parallel do not have to necessarily form a column. As shown in this drawing, the aging device cells may be spread and distributed in the entire region on the chip. It is to be noted that reference numeral 110 denotes a chip; 111, a cell; and 112, a decoder which decodes a combined output signal from the plurality of cells 111 in the drawing.

According to such a structure, an influence of manufacturing unevenness of the aging devices on the lifetime can be eliminated, and an influence of a defective bit can be also removed.

Fifth Embodiment

A description will now be given as to a countermeasure against a defective bit when a normally-on MOS transistor is used as an aging device in this embodiment.

In the normally-on type, when an end of a lifetime is reached, an off state changes to an on state. A lifetime of a defective bit is generally shorter than that of a normal bit. Therefore, arranging a plurality of such aging devices in series allows a normal bit to interrupt access between a source and a drain even when a defective bit enters the on state earlier than the normal bit.

Figure 20A:
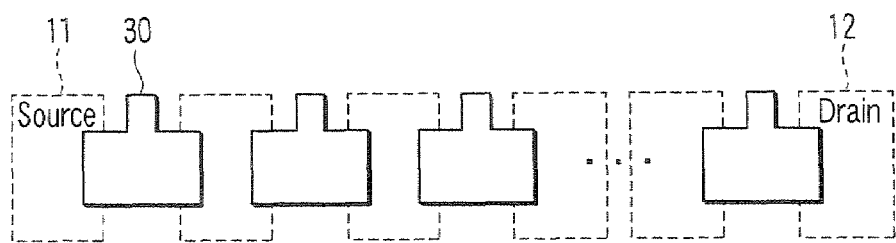
FIGS. 20A and 20B are plan views of examples in which aging devices are connected in series as a countermeasure against a normally-on-type defective bit in order to illustrate a semiconductor device according to a fifth embodiment.
Figure 20B:
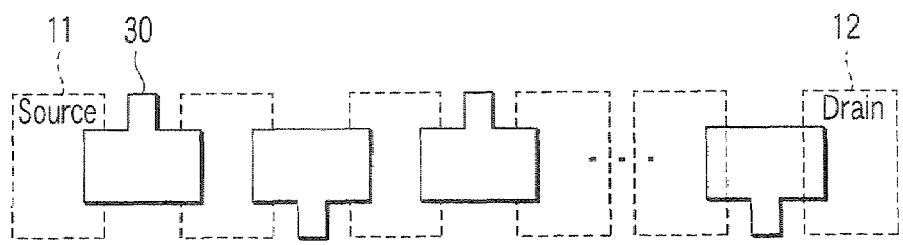

As shown in FIGS. 20A and 20B, the plurality of (N) aging devices described in the first embodiment are connected in series with source and drain diffusion layers of a first MOS transistor being used as connection terminals. FIG. 20A shows an example where T-shaped floating gate electrodes 30 face the same direction, and FIG. 20B shows an example where some of floating gate electrodes 30 face an opposite direction. In this manner, the directions can be freely changed.

Figure 21:
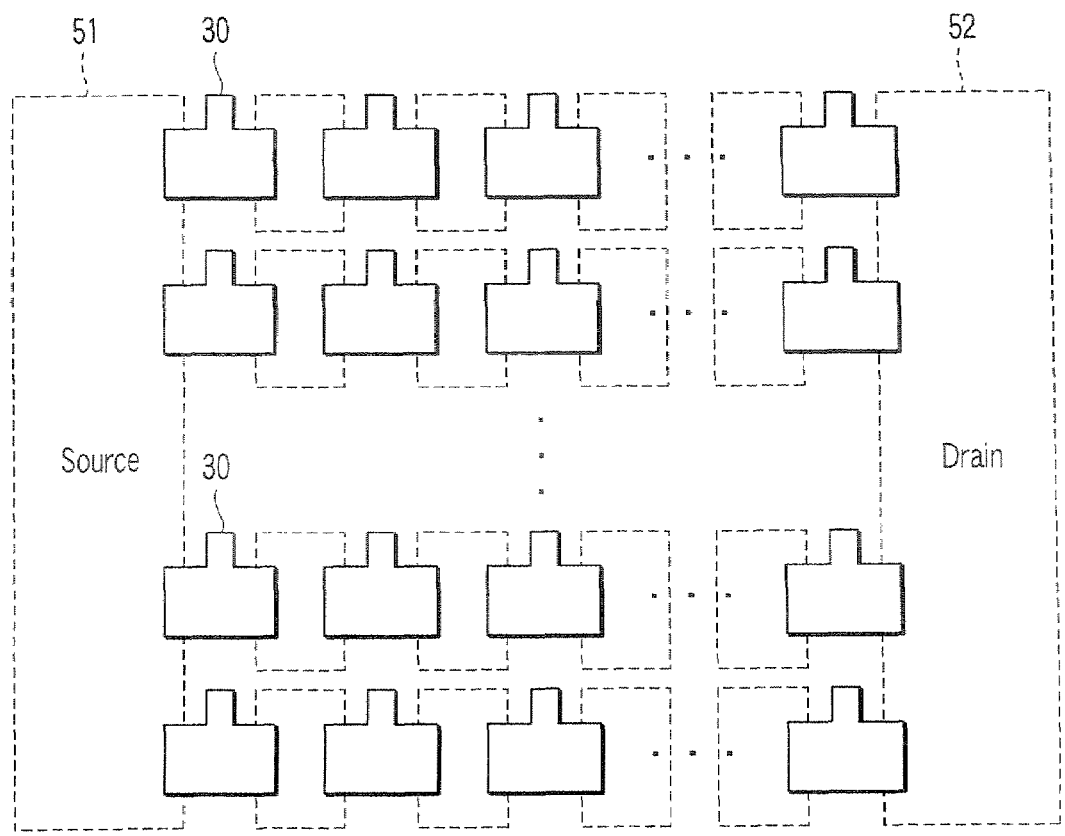
FIG. 21 is a plan view showing an example in which a plurality of series circuits of the aging devices depicted in FIG. 20A are connected in parallel.

FIG. 21 shows an example where a plurality of such aging devices as depicted in FIG. 20A are connected in parallel. For example, a matrix arrangement of 20×20 is provided.

As described above, according to this embodiment, when the plurality of normally-on aging devices are connected in series, an influence of a defective bit whose lifetime is shorter than that of a normal bit can be eliminated. Additionally, when the plurality of series connection circuits are further connected in parallel, lifetime characteristics can be averaged. Further, when the plurality of series connection circuits are arranged in parallel, even if a complete defective bit (which is not turned on due to disconnection or the like) exists in any series connection circuit, this bit can be remedied.

Sixth Embodiment

A description will now be given as to a countermeasure against an of-on-off-type defective bit in this embodiment. Incidentally, in this embodiment, it is assumed that a lifetime $\tau 1$ of a normally-on type is shorter than a lifetime $\tau 2$ of a normally-off type and a lifetime of a defective bit is shorter than (a minimum value in) a range of statistical unevenness in lifetime of a normal bit.

Figure 22A:
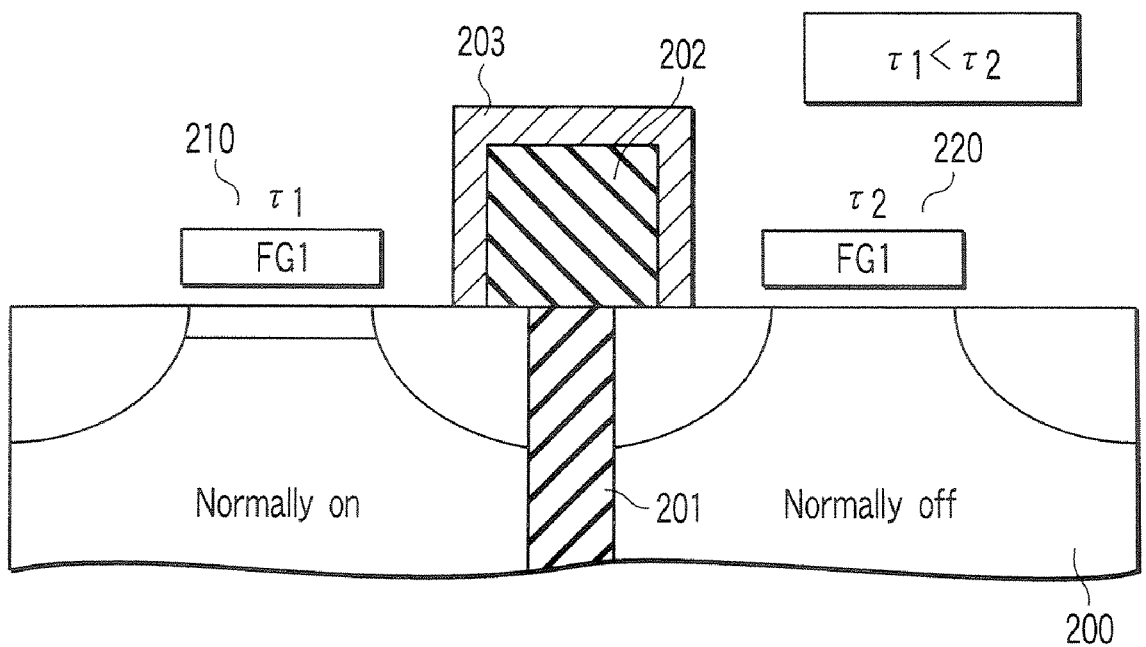
FIGS. 22A and 22B are element structure cross-sectional views showing off-on-off-type aging devices in order to illustrate a semiconductor device according to a sixth embodiment.
Figure 22B:
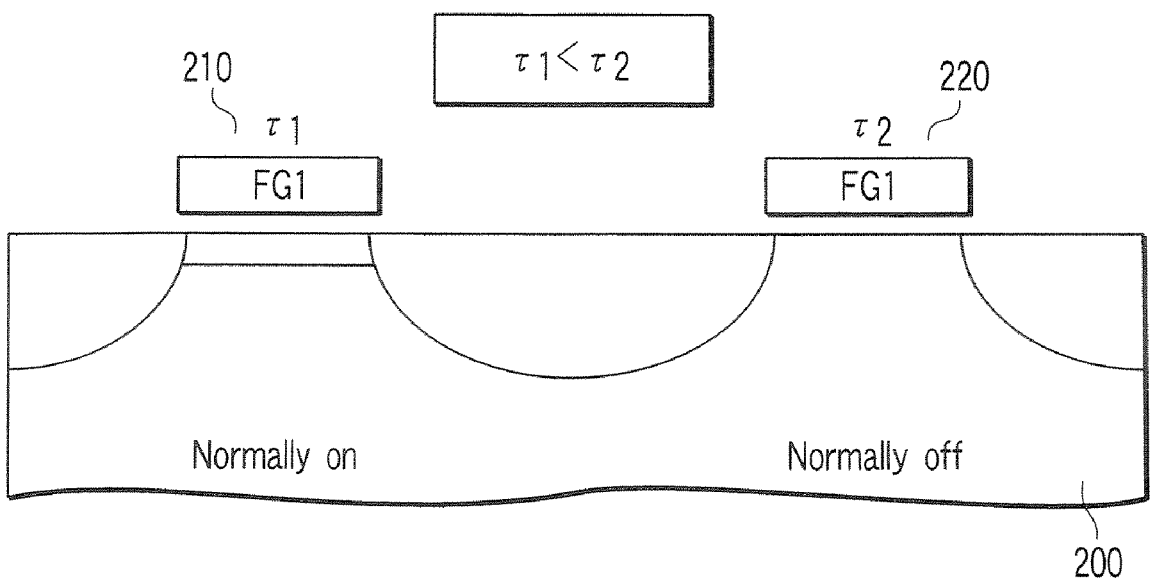

As shown in FIGS. 22A and 22B, a normally-on aging device 210 having the lifetime $\tau 1$ and a normally-off aging device 220 having the lifetime $\tau 2$ ($\tau 1 < \tau 2$) are connected in series with source and drain diffusion layers sandwiching a first floating gate (FG1) being used as connection terminals. A metal wiring line 203 is used for connection in FIG. 22A, and one of the source and drain diffusion layers is a common diffusion layer for connection in FIG. 22B. Further, a voltage applied to a word line contact CG in writing is inverted depending on the normally-on type and the normally-off type.

It is to be noted that reference numeral 200 denotes a silicon substrate; 201, an STI film; and 202, an insulating film between elements in the drawings.

Figure 23:
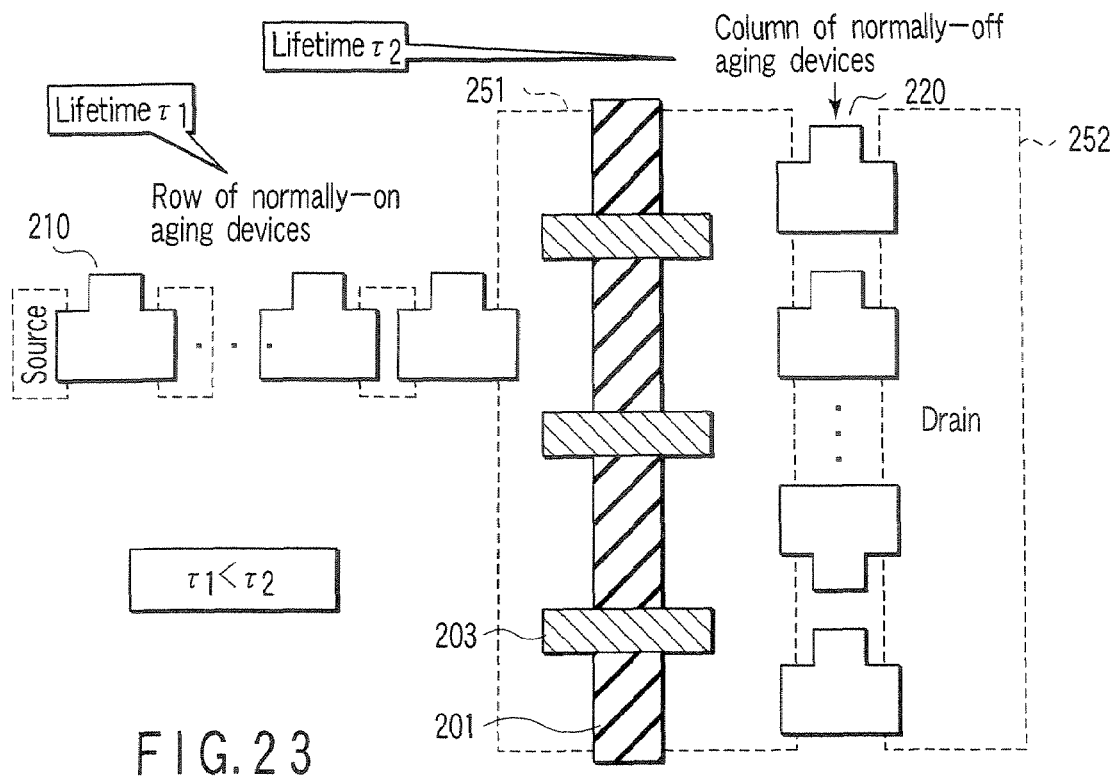
FIG. 23 is a plan view showing an example in which a plurality of normally-on- and normally-off-type aging devices are connected.
Figure 24:
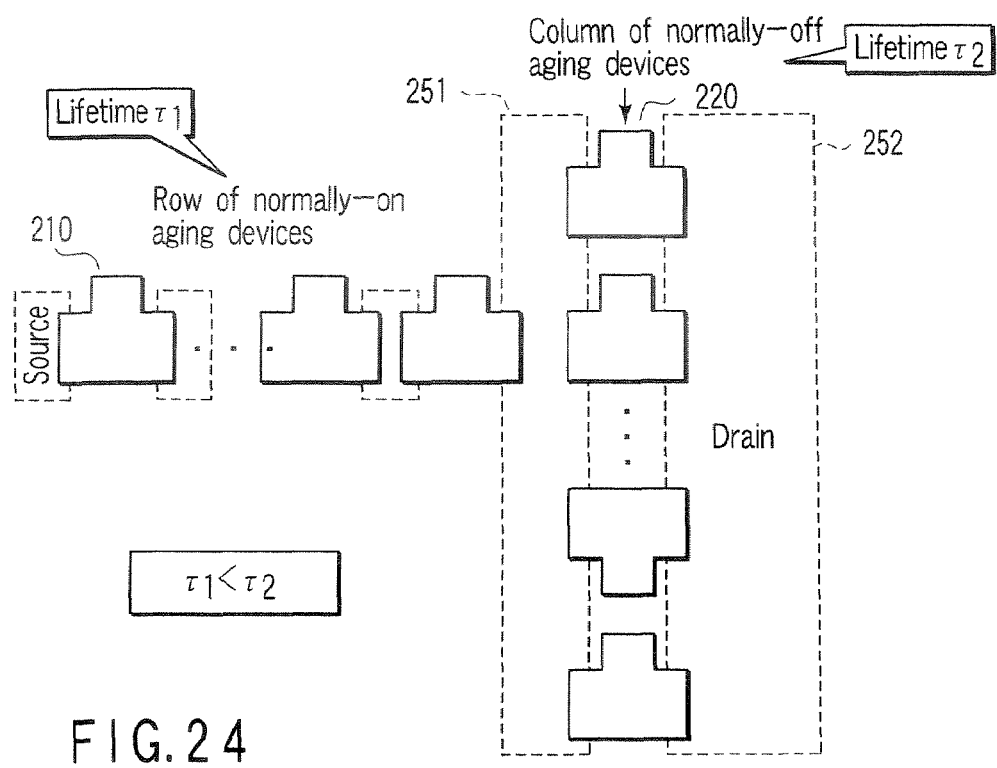
FIG. 24 is a plan view showing an example in which a plurality of normally-on- and normally-off-type aging devices are connected.

FIGS. 23 and 24 show examples in which a plurality of aging devices are connected for averaging. Normally-off aging devices 220 are connected in parallel, while normally-on aging devices 210 are connected in series, and these types of aging devices are connected in series, respectively. It is to be noted that reference numeral 251 designates a common source and 252 denotes a common drain in the drawing. In FIG. 23, a metal wiring line 203 is used for connection between the normally-off type and the normally-on type as in FIG. 22A. In FIG. 24, one of source and drain diffusion layers is a common diffusion layer as in FIG. 22B.

Figure 26:
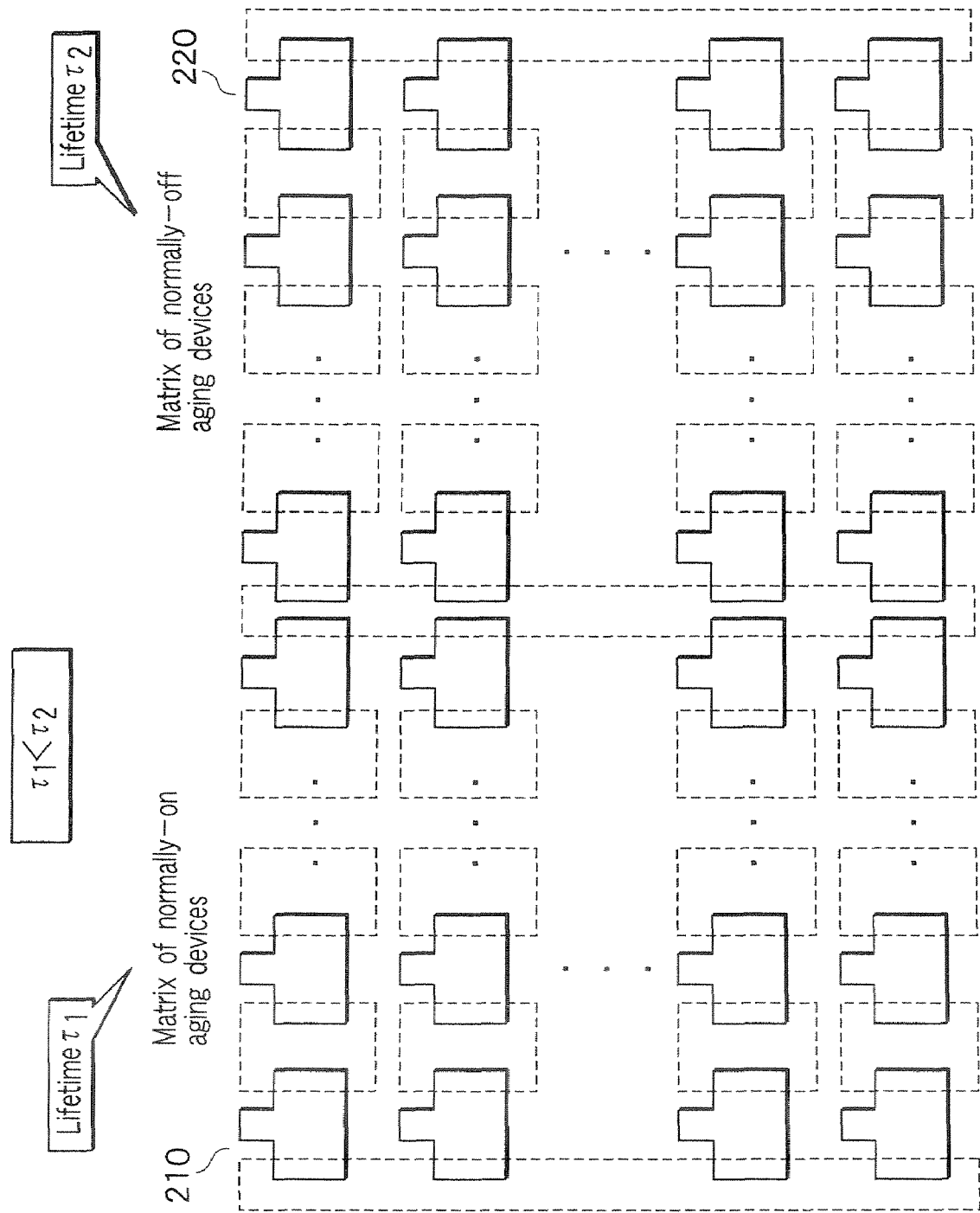
FIG. 26 is a plan view showing an example in which a plurality of normally-on- and normally-off-type aging devices are connected.

FIGS. 25 and 26 show examples where aging devices are connected in a matrix form for averaging. A matrix in which a plurality of series circuits having a plurality of normally-on aging devices with a lifetime $\tau 1$ arranged therein in series are connected in parallel and a matrix in which a plurality of series circuits having normally-off aging devices with a lifetime $\tau 2$ ($\tau 1 < \tau 2$) connected therein in series are connected in parallel are connected in parallel. In FIG. 25, a metal wiring line 203 is used for connection between the normally-off matrix and the normally-on matrix as in FIG. 22A. In FIG. 26, one of source and drain diffusion layers is a common diffusion layer as in FIG. 22B.

According to such a configuration, a defective bit can be removed, and statistical unevenness in lifetime of normal bits can be controlled. In particular, providing a matrix whose size is not smaller than 20×20 is advantageous when adding statistical correction, and hence a size which is not smaller than 20×20 is preferable. Even if the size is not greater than 20×20, a defective bit can be removed. As described above, the aging devices are designed or utilized in such a manner that the controlled $\tau 1$ and $\tau 2$ have a relationship of $\tau 1 < \tau 2$.

Seventh Embodiment

A description will now be given as to a countermeasure against an on-off-on-type defective bit and a method of improving lifetime controllability. Incidentally, in this embodiment, it is assumed that a lifetime $\tau 1$ of a normally-on type is longer than a lifetime $\tau 2$ of a normally-off type and a lifetime of a defective bit is shorter than (a minimum value in) a range of statistical unevenness of normal bits. Normally-on series circuits are connected in parallel, and normally-off aging devices are connected in parallel.

Figure 27:
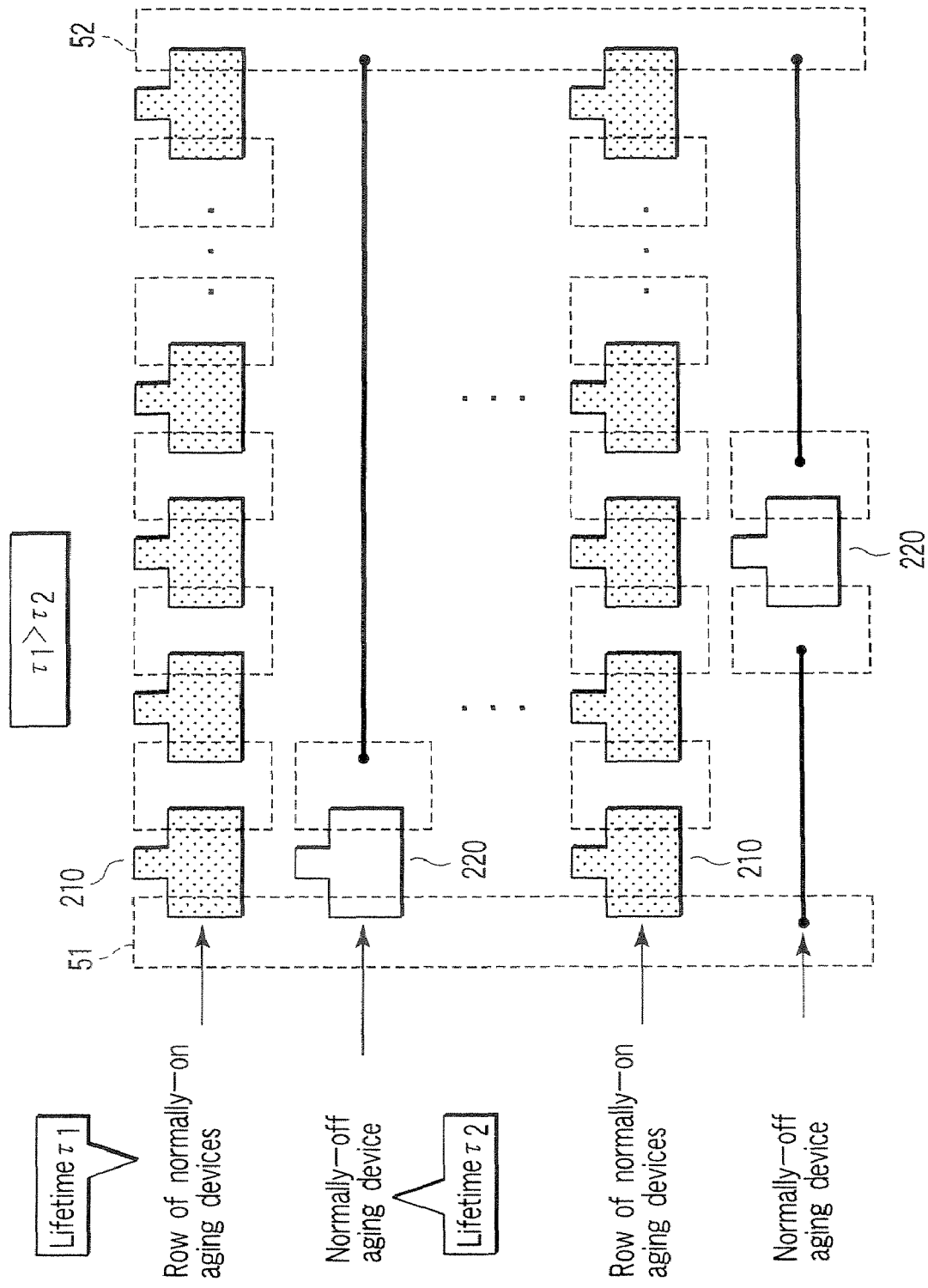
FIG. 27 is a plan view showing an example in which a plurality of aging devices are connected as a countermeasure against an on-off-on-type defective bit in order to illustrate a semiconductor device according to a seventh embodiment.

FIG. 27 shows an example of this embodiment, and a plurality of series circuits (row) of normally-on aging devices 210 and normally-off aging devices 220 are connected in parallel. As the number of series circuits of the normally-on aging devices connected in series, 20 or above is preferable in order to add statistical correction. Of course, when this number is not greater than 20, a defective bit can be likewise removed. Furthermore, in regard to the normally-off type connected with a common source 51 or a common drain 52, a bit number of 20 or above is likewise preferable. In regard to the normally-on type connected with the common source 51 or the common drain 52, a bit number of 20 or above is also preferable. Of course, if the bit number is not greater than 20, a defective bit can be likewise removed.

Figure 28:
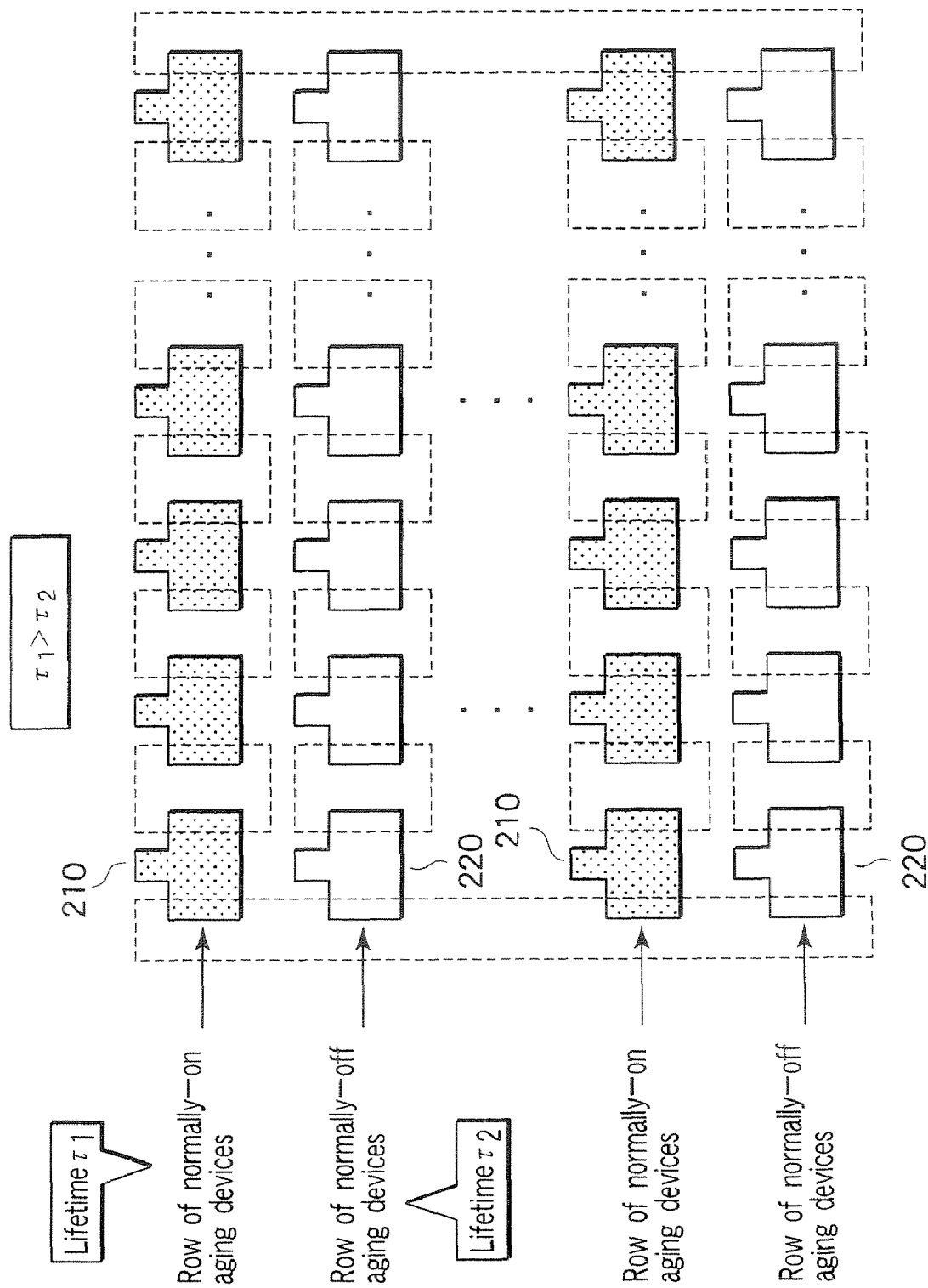
FIG. 28 is a plan view showing an example in which normally-on series circuits (row) and normally-off series circuits (row) are connected in parallel.

FIG. 28 shows another example of this embodiment in which a plurality of series circuits (row) of normally-on aging devices 210 and a plurality of series circuits (row) of normally-off aging devices 220 are connected in parallel. In regard to the number of normally-on and normally-off aging devices connected in series, 20 or above is preferable in order to add statistical correction. Of course, if this number is not greater than 20, a defective bit can be removed. Furthermore, as to the normally-off type connected with the common source 51 or the common drain 52, a bit number of 20 or above is likewise preferable. In regard to the normally-on type connected with the common source 51 or the common drain 52, a bit number of 20 or above is likewise preferable. Of course, even if the bit number is not greater than 20, a defective bit can be likewise removed.

According to such a structure, a defective bit can be removed, and it is possible to realize on-off-on-type aging devices having both τ1 and τ2 with unevenness in lifetime being statistically controlled.

Eighth Embodiment

A trimming technology to further improve lifetime control will now be described.

Figure 29:
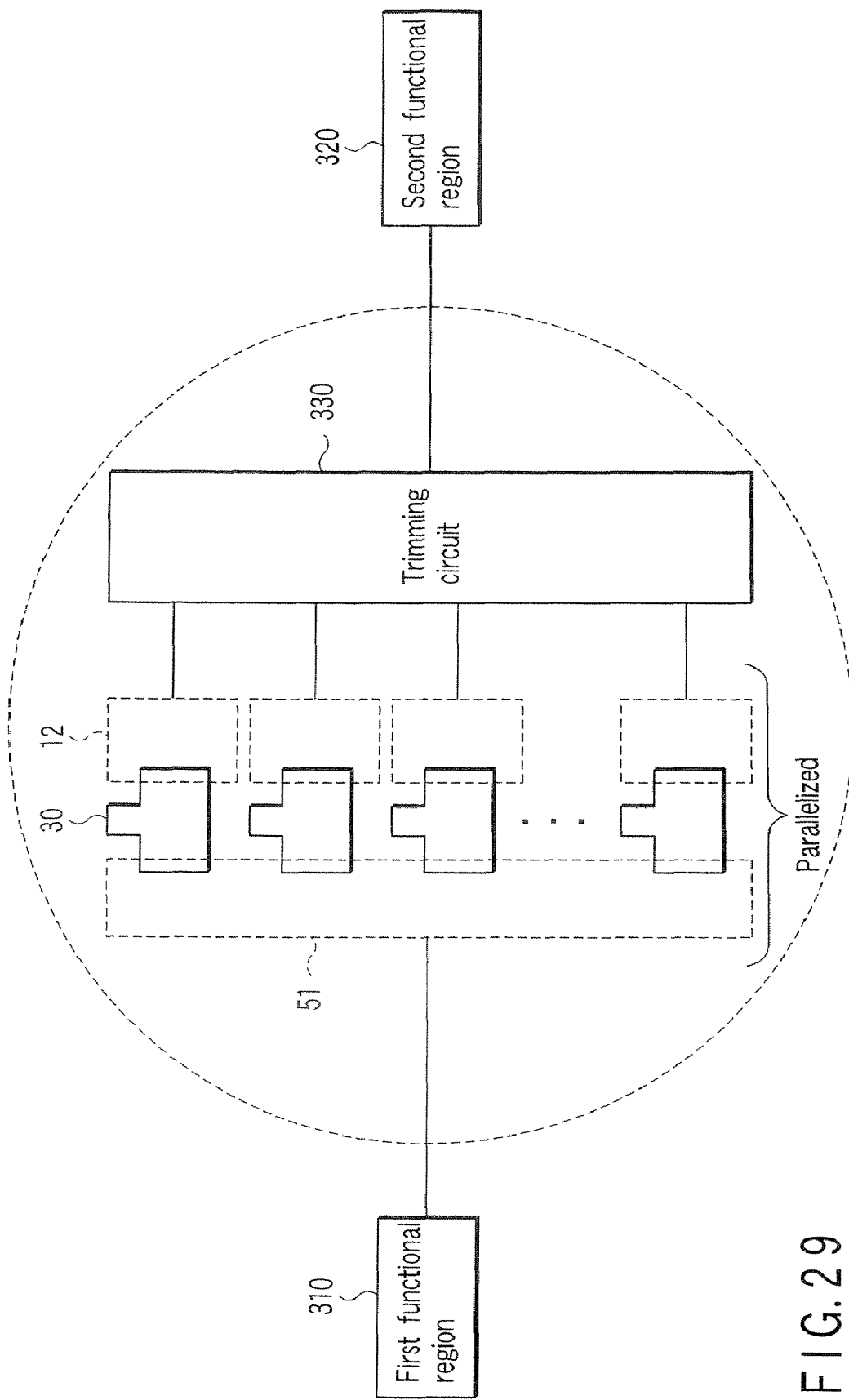
FIG. 29 is a schematic structural view showing a lifetime control circuit with a trimming circuit according to an eighth embodiment.

FIG. 29 is a schematic structural view showing a lifetime control circuit with a trimming circuit according to an eighth embodiment according to the present invention. A lifetime control circuit including aging devices and a trimming circuit 330 is inserted between a first functional region 310 and a second functional region 320. The first functional region and the second functional region are, e.g., a storage region (memory) and a decoder.

The lifetime control circuit is constituted of a structure in which the plurality of normally-off aging devices each having such a T-shaped gate electrode as shown in the first embodiment are connected in parallel, and the trimming circuit 330 which trims an undesired one of the outputs from the respective aging devices.

As described above, in an LSI having the memory 310, the decoder 320 and the lifetime control circuit, the aging devices and the trimming circuit 330 are inserted between the memory 310 and the decoder. One side of the aging devices is connected with the memory 310, and one side of the trimming circuit 330 is connected with the decoder 320, whereby the decoder 320 and the memory 310 can be accessed.

When the aging device is of the normally-off type, it enters the off state when a predetermined time elapses, and the memory 310 is disconnected from the decoder 320. Then, the decoder 320 cannot access the memory 310, and a function of the LSI is aborted. For example, when a decoding key which is required to break a code is stored in the memory 310, the decoder 320 cannot read the decoding key stored in the memory 310, thus realizing a validity period of the code. Conversely, in the normally-on type, when an end of the lifetime is reached, the decoding key can be read.

FIG. 30 is a view showing an apparatus in which a trimming circuit is mounted in a parallelizing circuit. A part surrounded by an alternate long and short dash line in the drawing corresponds to a trimming circuit 330, and a part surrounded by a broken line circle corresponds to an adding circuit 340. Before adding bits of aging devices, a trimming transistor 331 and an operational circuit 332 are connected in series. It is to be noted that reference numeral 200 in the drawing denotes an aging device, and a non-volatile memory having a two-layer gate structure with a floating gate and a control gate is used as the trimming transistor 331. Reference numeral 333 designates a memory storing a predetermined current value IA; 341, a sense circuit; and 342 is a memory storing a reference signal 10.

It is to be noted that a single gate non-volatile memory (as shown in FIG. 1) can be used as the trimming transistor 331.

It is to be noted that the operational circuit 332 is provided with four terminals. A first terminal is electrically connected with a diffusion layer of the trimming transistor 331, a second terminal is electrically connected with the control gate of the trimming transistor 331, a third terminal is electrically connected with the memory 333, and a fourth terminal is connected with the adding circuit 340.

First, electric charge are injected into the non-volatile memory 331 to enter the on state. In practice, a method of setting the non-volatile memory 331 to the on state varies depending on whether this non-volatile memory is of the normally-on type or the normally-off type or whether source and drain regions are of an n type or a p type. This method is realized by injecting or discharging electric charge (electrons or holes) in accordance with each type. Here, for simplicity, a description will be given as to an example where electric charge is injected to provide the on state, but the principle of the present invention is the same even when electric charge is removed to provide the on state. Of course, electric charge holding characteristics of this non-volatile memory must be sufficiently longer than a lifetime of each aging device.

Subsequently, this operational circuit 332 is used to apply a drain voltage to the aging device 200. This drain current is sensed by the operational circuit 332 and compared with a preset current level IA. This IA is a threshold value which discriminates a group of aging devices which have a long lifetime and a group of aging devices which have a short lifetime. The trimming circuit can eliminate an aging device belonging to the group of a long lifetime if a current flowing when this aging device is turned on is lower than this IA. Specifically, when the drain current sensed in this example is smaller than IA, a voltage is applied to the control gate of the non-volatile memory 331 to enter the off state. In this manner, corresponding bits are prevented from being added. As described above, trimming is executed by rewriting the threshold value of the non-volatile memory 331.

Figure 31:
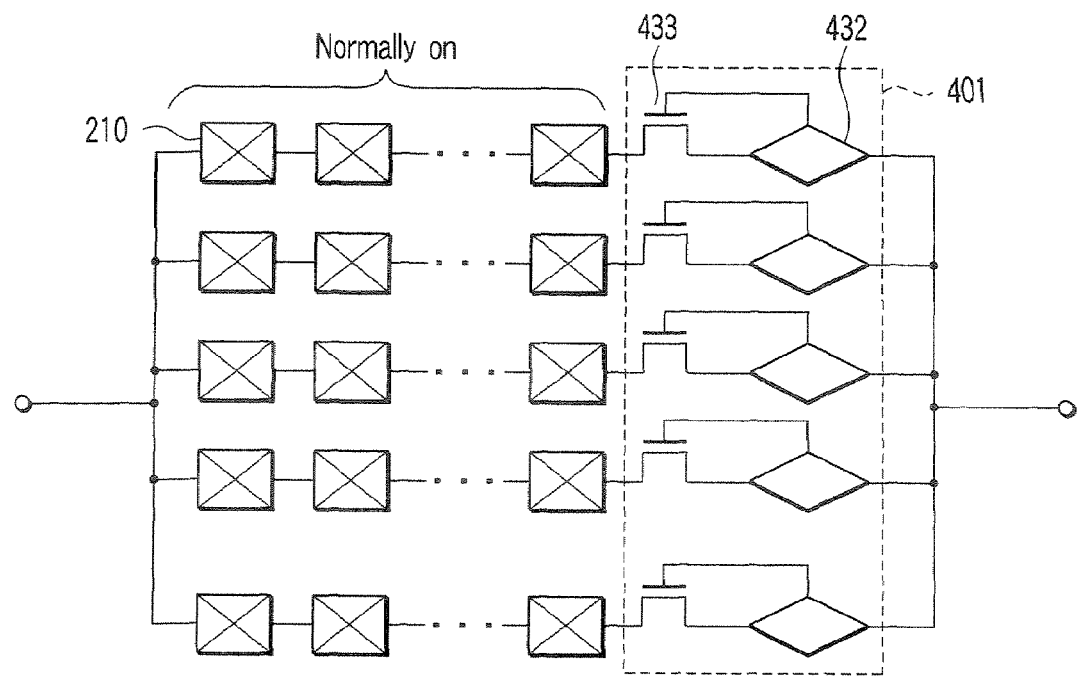
FIG. 31 is a view showing an example in which a lifetime control circuit is constituted of normally-on circuits and a trimming circuit in order to illustrate a ninth embodiment.

On the other hand, when the drain current sensed in this example is not smaller than IA, addition is performed without modification. An added result is sensed by the sense circuit 341 and compared with the reference signal 10. Here, an added current which has disconnected a long-lifetime bit by using IA is characterized in that it precipitously falls with the longest lifetime in the remaining bits since there is no lifetime prolongation. Therefore, it is possible to minimize an error which may occur in comparison with the reference signal 10. Furthermore, when information indicative of a result of this trimming is stored in a newly prepared memory (a magnetic memory, an MRAM, a non-volatile memory, a ROM, cash memory or the like) and reference is made to this information when reading the added current, rewriting the threshold value of the trimming transistor is not necessarily required. Moreover, it is desirable to arrange this memory in the operational circuit in the trimming circuit or arrange the same to be accessed. At this time, a regular MOSFET may be used as the trimming transistor as shown in FIG. 31.

As described above, according to this embodiment, the aging device 200 with a small drain current can be separated by using the non-volatile memory 331 and the operational circuit 332, thus compensating a defective bit. Therefore, highly reliable lifetime control can be realized.

Ninth Embodiment

Another example of a lifetime control circuit provided with a trimming circuit will now be described. It is to be noted that a block with reference numeral 210 denotes an aging device in the following description.

In FIG. 31, a plurality of series circuit in which a plurality of normally-on aging devices are connected in series are arranged in parallel. One side of the series circuits is connected with an input terminal in common, and the other side is connected with a trimming circuit 401, respectively. The trimming circuit 401 is constituted of an MOS transistor 433 and an operational circuit 432 with respect to one series unit.

Operation of the trimming circuit 401 is substantially the same as that of the trimming circuit 330 depicted in FIG. 30 although a memory 333 is omitted. That is, it can be considered that a memory region storing an IA exists in the operational circuit 432.

Figure 32:
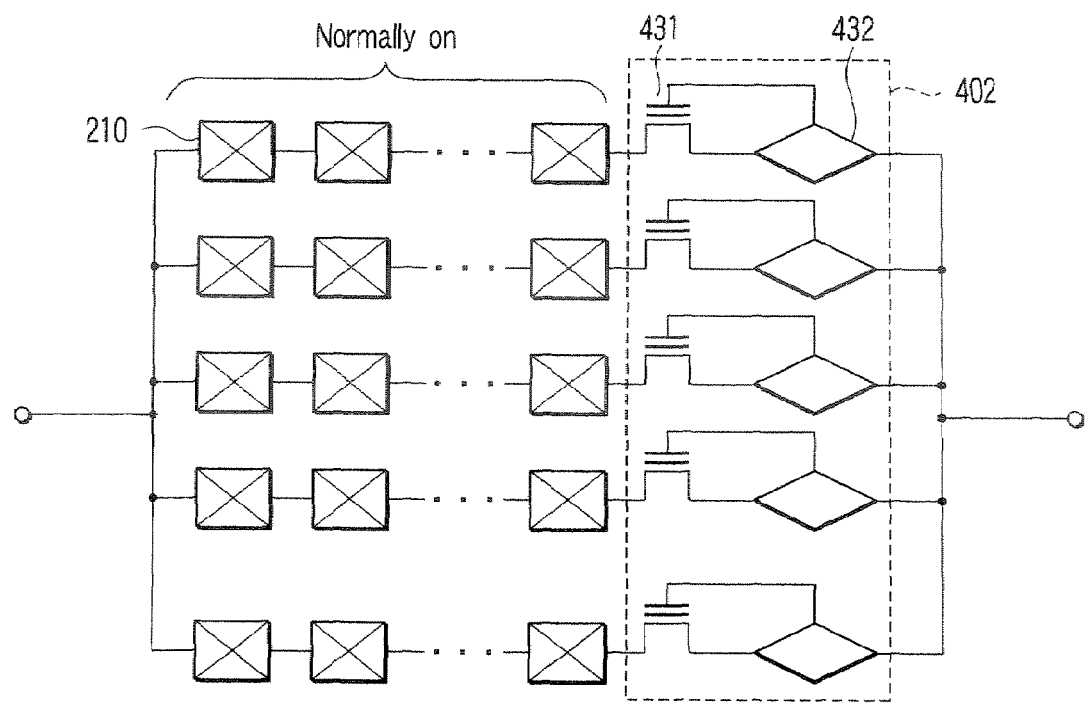
FIG. 32 is a view showing an example in which EEPROMs are used in place of MOS transistors depicted in FIG. 31.
Figure 33:
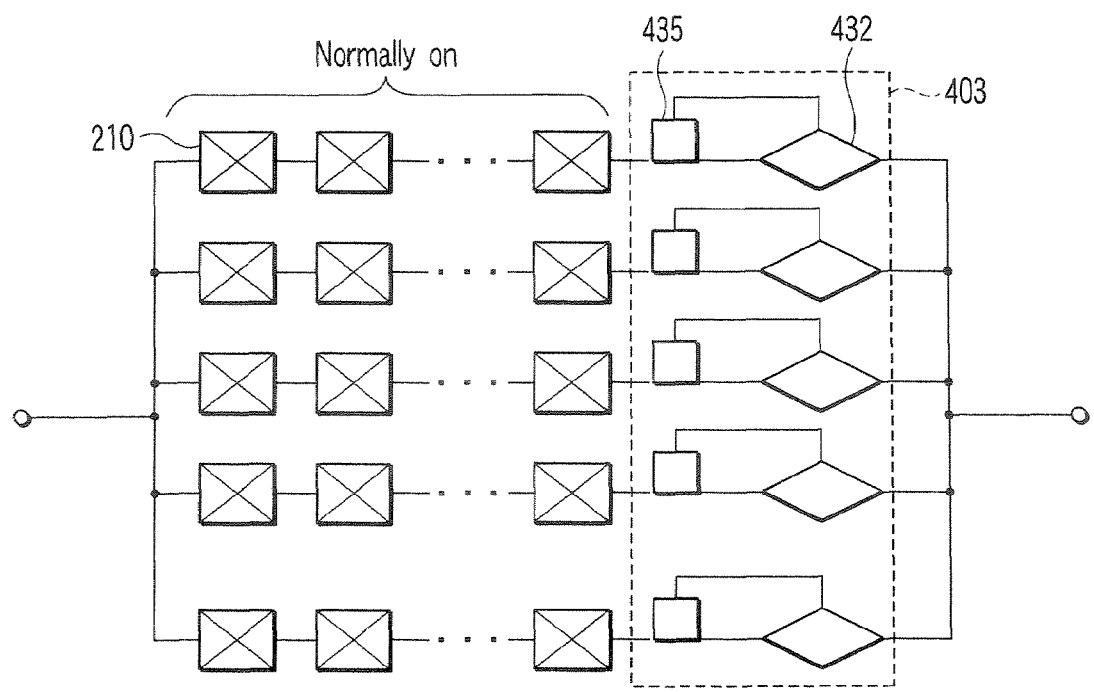
FIG. 33 is a view showing an example in which breakers are used in place of MOS transistors depicted in FIG. 31.
Figure 34:
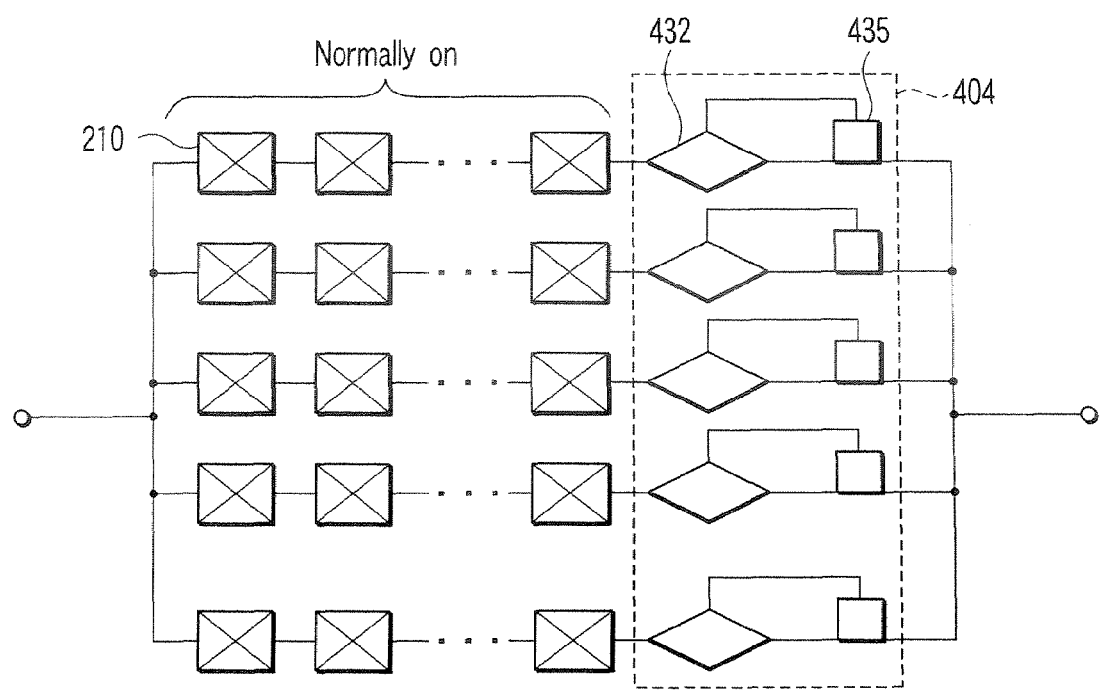
FIG. 34 is a view showing an example in which positions of the breakers and operational circuits depicted in FIG. 33 are exchanged.
Figure 36:
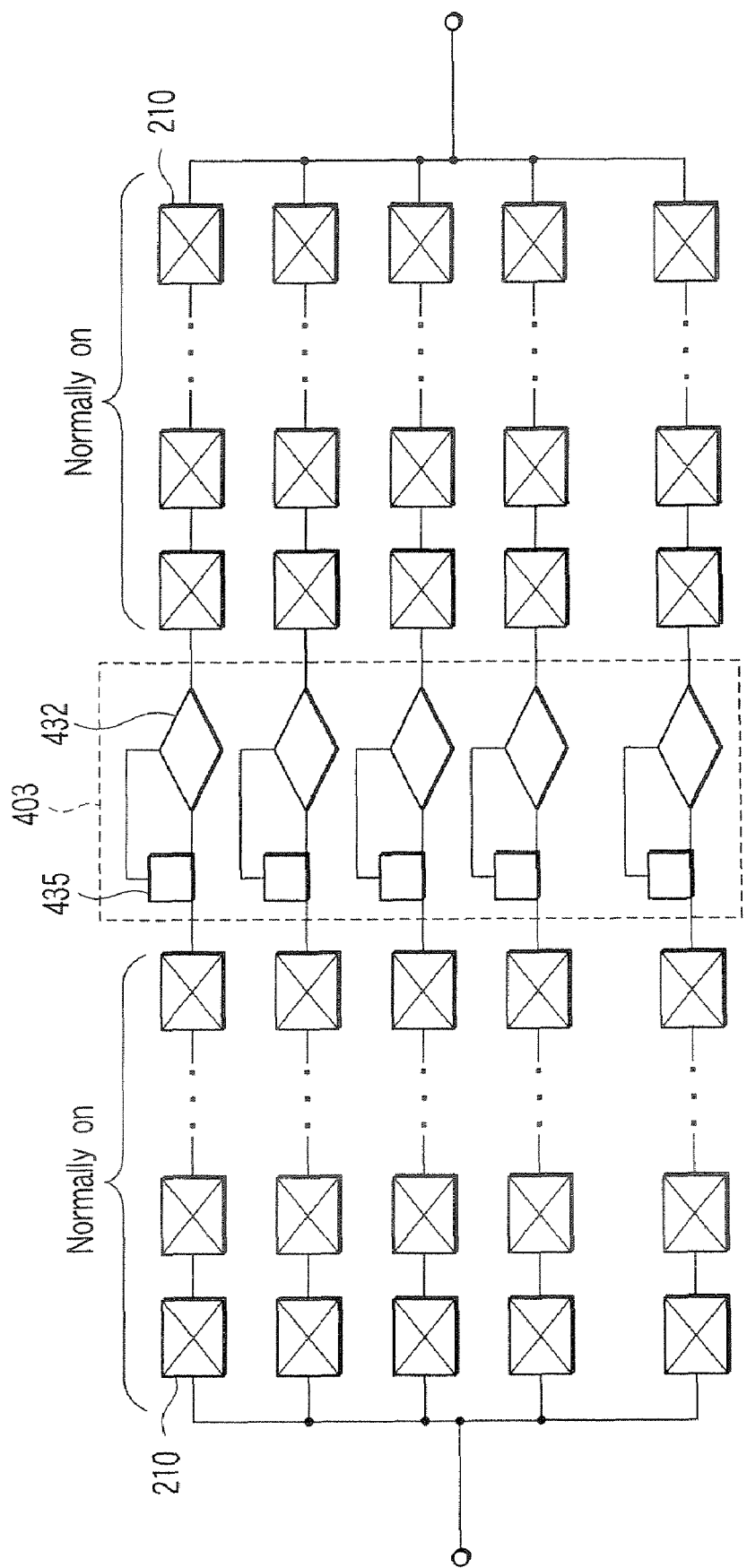
FIG. 36 is a view as a combination of FIGS. 34 and 35, showing an example in which the aging devices are arranged on both sides of the trimming circuit.

In FIG. 32, an EEPROM 431 is used in place of the MOS transistor 433 depicted in FIG. 31. A single-gate EEPROM (as shown in FIG. 1) can be used in place of the two-layer gate nonvolatile memory 331 in FIG. 30. In FIG. 33, a breaker 435 is used as a trimming circuit 403 in place of the MOS transistor 433 shown in FIG. 31. In FIG. 34, positions of the breakers 435 and the operational circuits 432 depicted in FIG. 33 are exchanged. In FIG. 35, the aging devices depicted in FIG. 33 are arranged on the right-hand side of a trimming circuit 403. In FIG. 36, a trimming circuit 403 is arranged in series chains of the aging devices. In FIG. 37, each breaker 435 is inserted into series connecting portions of the aging devices.

In FIG. 38, normally-off aging devices are used, and one side of the plurality of aging devices is connected with an input terminal in common while the other side is connected with a trimming circuit 405. The trimming circuit 405 is constituted of breakers 435 and operational circuits 432.

FIG. 39 is a modification of FIG. 38. In this configuration, aging devices 200 are arranged on the right-hand side of a trimming circuit 405. In FIG. 40, positions of aging devices 220, breakers 435 and operational circuits 432 which are connected in series are changed in accordance with each row. In this manner, an arrangement position of each element can be freely changed as long as the respective elements are connected in series.

Figure 41:
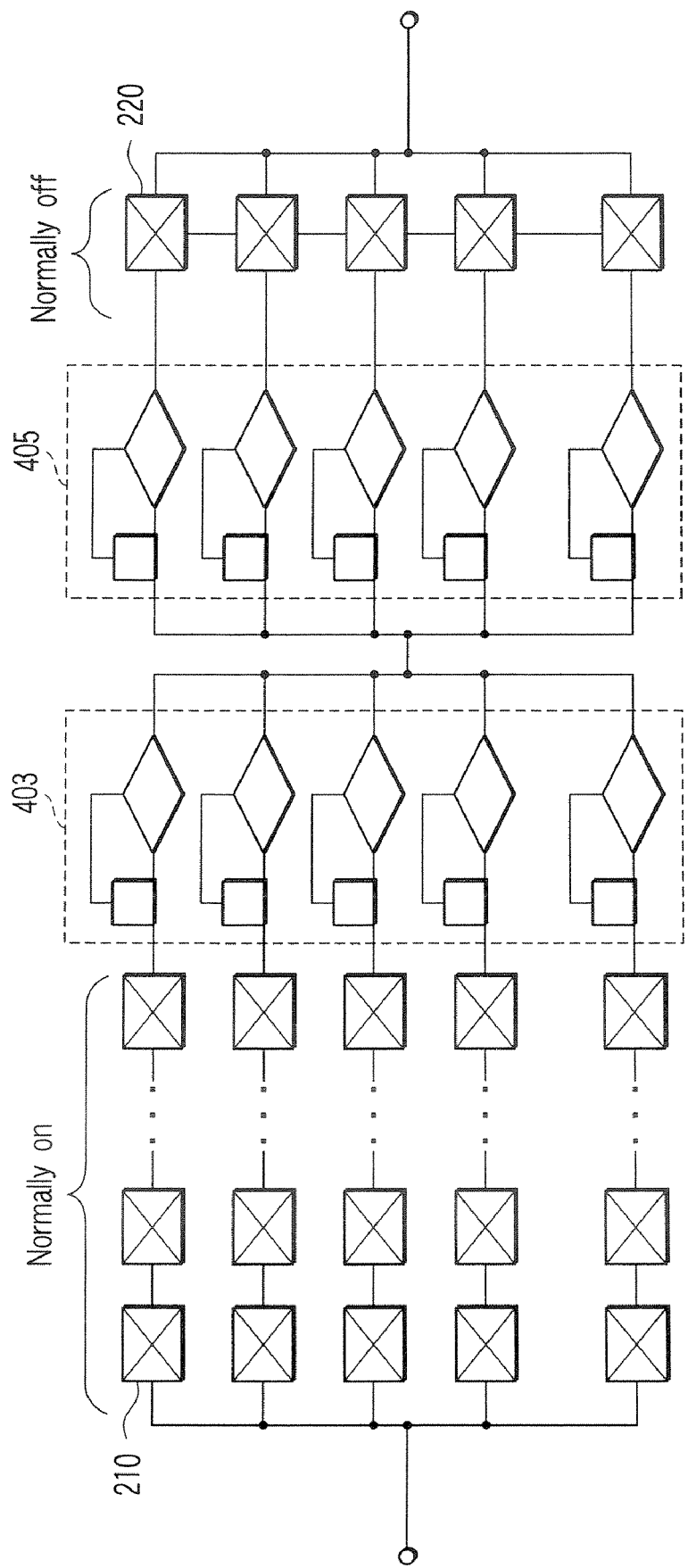

FIG. 41 is a combination of FIGS. 33 and 39. In this configuration, a trimming circuit 403 is connected on the right-hand side of normally-on aging devices, and a trimming circuit 405 is connected on the left-hand side of normally-off aging devices. Further, the trimming circuits 403 and 405 are connected with each other.

According to such a configuration, a defective bit can be eliminated, and it is possible to minimize statistical unevenness in lifetime evaluated through a comparison between an added current of normal bits and a reference signal 10. Furthermore, it is preferable for the number of parallel connections in this embodiment to be not smaller than 20. Of course, even if the number is less than 20, the rescue for a defective bit is applicable in this system.

It is to be noted that the input terminals mentioned above can be connected to one of a first and a second function block as shown in FIG. 29, and the output terminal mentioned above can be connected to the other.

Tenth Embodiment

Figure 42:
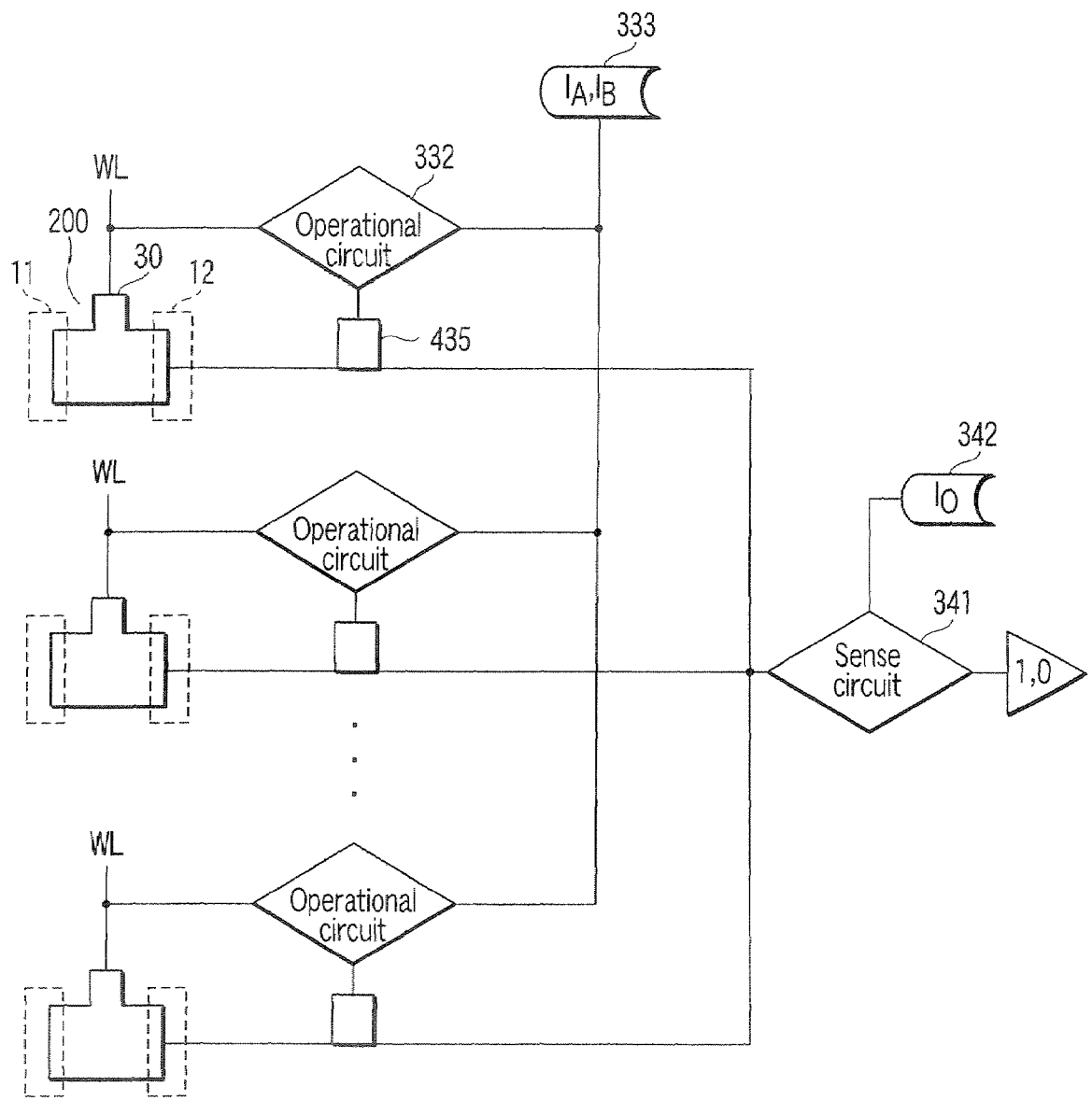
FIG. 42 is a schematic structural view showing a lifetime control circuit with a trimming circuit according to a tenth embodiment.

As shown in FIG. 42, one terminal (an output terminal) of each of a plurality of aging devices 200 is connected with a sense circuit 341 through each breaker 435. Each operational circuit 332 is connected with each breaker 435, and a word line WL and a memory 333 are connected with the other two input terminals of each operational circuit 332. Moreover, the operational circuit 332 senses a current flowing through the WL in injection of electric charge when a control voltage is applied, and compares the sensed value with IA and IB. If the sensed value is not a desired current value, the breaker 435 is turned off. A WL layout is as shown in, e.g., FIG. 18.

Even if such a configuration is adopted, trimming can be realized as in the eight and ninth embodiments.

Additionally, in this embodiment, since a gate current flowing through the WL is used in place of a drain current flowing through a source or a drain of each aging device in the eight and ninth embodiments, this embodiment can cope with both the normally-on type and the normally-off type. Further, storing one of IA and IB in the memory 333 can suffice. In the case where IA alone is stored, this configuration matches with the eight and ninth embodiments, but both IA and IB can be likewise used in the eighth and ninth embodiments. In any case, the effect is the same. In case of using both IA and IB, electrical conduction is achieved only when a current flowing through the operational circuit 332 is a value between IA and IB. When this current is not a value between IA and IB, the breaker 435 or the trimming transistor 331, 425, 433 or 431 is used to turn off.

(Modification)

It is to be noted that the present invention is not restricted to each of the foregoing embodiments. Although the description has been given as to the aging device in the foregoing embodiments, the present invention can be used as an electrically rewritable non-volatile memory (an EEPROM). Specifically, when an oxide film is used as a gate dielectric film, increasing the film thickness of the oxide film to be not smaller than 3.3 nm can hold electric charge for more than 10 years, and hence the present invention can be used as a non-volatile memory.

Furthermore, the first and second semiconductor regions are not necessarily restricted to the p type, and this type can be appropriately changed in accordance with the electrical conduction type of an MOS transistor to be formed. Conductivity types of the first semiconductor region and the second semiconductor region may be exchanged. Moreover, conditions such as size of the semiconductor region, shape or size of the gate electrode, material or thickness of the gate dielectric film and others can be appropriately changed in accordance with a specification.

Additionally, the source and drain diffusion layers may be Schottky source and drain using a Schottky junction. Further, a floating gate (FG) composed of a single-polysilicon layer may be a single FG composed of a metal. Furthermore, how to use gate length and gate width in this specification is opposite to that in the conventional method of prior devices, and that is because the gate has a T-shape.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a semiconductor substrate;
a first semiconductor region and a second semiconductor region formed on the semiconductor substrate to be insulated and separated from each other;
a first gate dielectric film formed on the first semiconductor region;
a second gate dielectric film formed on the second semiconductor region;
a floating gate electrode extending over the first gate dielectric film and the second gate dielectric film, and overlapping with the first semiconductor region and the second semiconductor region, an overlapping area of the floating gate electrode and the first semiconductor region being larger than an overlapping area of the floating gate electrode and the second semiconductor region, such that a coupling capacitance between the floating gate electrode and the first semiconductor region is larger than a coupling capacitance between the floating gate electrode and the second semiconductor region;

first and second diffusion layers formed on a surface of the first semiconductor region to interpose the floating gate electrode therebetween;

a bit line connected to one of the first and second diffusion layers;

a source line connected to the other of the first and second diffusion layers;

third and fourth diffusion layers formed on a surface of the second semiconductor region to interpose the floating gate electrode therebetween; and a word line connected to the third and fourth diffusion layers in common, wherein the bit line and the source line are arranged above the word line and arranged in a direction perpendicular to the word line.

2. The semiconductor device according to claim 1, wherein each of the first gate dielectric film and the second gate dielectric film has a thickness which is not smaller than 3.3 nm, and the semiconductor device comprises an electrically rewritable non-volatile semiconductor memory.

3. The semiconductor device according to claim 1, wherein each of the first gate dielectric film and the second gate dielectric film has a thickness which is less than 3.3 nm, and the semiconductor device comprises an aging device which is turned on or off for a predetermined time by leakage of stored charge.

4. The semiconductor device according to claim 1, wherein the floating gate electrode has a T-shape, and a width of the floating gate electrode on the first semiconductor region side is larger than a width of the floating gate electrode on the second semiconductor region side.

5. The semiconductor device according to claim 1, wherein the first semiconductor region and the second semiconductor region have a p type conductivity, and the first, second, third and fourth diffusion layers have an n type conductivity.

6. The semiconductor device according to claim 1, wherein the first gate dielectric film and the second gate dielectric film are formed of the same material and have the same thickness.

7. A semiconductor device functioning as an aging device which is turned on or off for a predetermined time by leakage of stored charge, comprising:

a semiconductor substrate;

a first semiconductor region and a second semiconductor region formed on the semiconductor substrate to be insulated and separated from each other;

a first gate dielectric film with a thickness less than 3.3 nm, which is formed on the semiconductor substrate to overlap the first semiconductor region;

a second gate dielectric film with a thickness less than 3.3 nm which is formed on the semiconductor substrate to overlap the second semiconductor region;

a floating gate electrode extending over the first gate dielectric film and the second gate dielectric film to overlap with the first semiconductor region and the second semiconductor region, and formed into a T-shape in such a manner that an overlapping area of the floating gate electrode and the first semiconductor region is larger than an overlapping area of the floating gate electrode and the second semiconductor region, and formed in such a manner that a coupling capacitance between the floating gate electrode and the first semiconductor region is larger than a coupling capacitance between the floating gate electrode and the second semiconductor region;

first and second diffusion layers which are formed on a surface of the first semiconductor region to interpose a part below the floating gate electrode therebetween, one of the first and second diffusion layers being connected to a bit line while the other of the same being connected to a source line; and third and fourth diffusion layers which are formed on a surface of the second semiconductor region to interpose a part below the floating gate electrode therebetween and connected to a word line in common, wherein the bit line and the source line are arranged above the word line and arranged in a direction perpendicular to the word line.

8. The semiconductor device according to claim 7, wherein the first gate dielectric film and the second gate dielectric film are formed of the same material and have the same thickness.

* * * * *